(12) United States Patent
Huo et al.

(10) Patent No.: US 11,114,458 B2
(45) Date of Patent: Sep. 7, 2021

(54) THREE-DIMENSIONAL MEMORY DEVICE WITH SUPPORT STRUCTURES IN GATE LINE SLITS AND METHODS FOR FORMING THE SAME

(71) Applicant: YANGTZE MEMORY TECHNOLOGIES CO., LTD., Wuhan (CN)

(72) Inventors: Zongliang Huo, Wuhan (CN); Haohao Yang, Wuhan (CN); Wei Xu, Wuhan (CN); Ping Yan, Wuhan (CN); Pan Huang, Wuhan (CN); Wenbin Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 15 days.

(21) Appl. No.: 16/670,594

(22) Filed: Oct. 31, 2019

(65) Prior Publication Data

US 2020/0395376 A1    Dec. 17, 2020

Related U.S. Application Data

(63) Continuation of application No. PCT/CN2019/102121, filed on Aug. 23, 2019.

(30) Foreign Application Priority Data

Jun. 17, 2019    (CN) .......................... 201910522007.2

(51) Int. Cl.
*H01L 27/11565*    (2017.01)
*H01L 27/11582*    (2017.01)
*H01L 27/1157*    (2017.01)

(52) U.S. Cl.
CPC .. *H01L 27/11582* (2013.01); *H01L 27/11565* (2013.01); *H01L 27/1157* (2013.01)

(58) Field of Classification Search
CPC ................................................ H01L 27/11565
See application file for complete search history.

(56) References Cited

U.S. PATENT DOCUMENTS 9,754,963 B1    9/2017    Kawamura et al.
10,050,054 B2    8/2018    Zhang et al.
(Continued)

FOREIGN PATENT DOCUMENTS

CN        104659033 A    5/2015
CN        105097822 A    11/2015
(Continued)

OTHER PUBLICATIONS

International Search Report issued in corresponding International Application No. PCT/CN2019/102133, dated Mar. 20, 2020, 5 page.
(Continued)

*Primary Examiner* — Christopher A Johnson
(74) *Attorney, Agent, or Firm* — Bayes PLLC

(57) ABSTRACT

Embodiments of structure and methods for forming a three-dimensional (3D) memory device are provided. In an example, the 3D memory device includes a memory stack having interleaved a plurality of conductor layers and a plurality of insulating layers extending laterally in the memory stack. The 3D memory device also includes a plurality of channel structures extending vertically through the memory stack into the substrate. The 3D memory device further includes at least one slit structure extending vertically and laterally in the memory stack and dividing a plurality of memory cells into at least one memory block, the at least one slit structure each including a plurality of slit openings and a support structure between adjacent slit
(Continued)

openings. The support structure may be in contact with adjacent memory blocks and contacting the substrate.

20 Claims, 28 Drawing Sheets

(56) References Cited

U.S. PATENT DOCUMENTS

| | | | |
|---|---|---|---|
| 10,269,820 | B1 | 4/2019 | Kaminaga |
| 2008/0164491 | A1 | 7/2008 | Liu et al. |
| 2012/0094453 | A1 | 4/2012 | Han et al. |
| 2012/0098049 | A1 | 4/2012 | Moon et al. |
| 2013/0168800 | A1 | 7/2013 | Shim et al. |
| 2014/0217488 | A1 | 8/2014 | Thimmegowda et al. |
| 2014/0284697 | A1 | 9/2014 | Wang et al. |
| 2015/0318301 | A1 | 11/2015 | Lee et al. |
| 2015/0357341 | A1 | 12/2015 | Yeh et al. |
| 2016/0126252 | A1 | 5/2016 | Tsuda et al. |
| 2016/0336338 | A1 | 11/2016 | Song et al. |
| 2016/0358933 | A1 | 12/2016 | Rabkin et al. |
| 2017/0047334 | A1* | 2/2017 | Lu .................... H01L 27/11575 |
| 2017/0117289 | A1 | 4/2017 | Liu et al. |
| 2017/0309339 | A1 | 10/2017 | Hsiung et al. |
| 2018/0097009 | A1 | 4/2018 | Zhang et al. |
| 2018/0233513 | A1 | 8/2018 | Zhang et al. |
| 2018/0366483 | A1 | 12/2018 | Choi |
| 2019/0067314 | A1 | 2/2019 | Lu et al. |
| 2019/0096899 | A1 | 3/2019 | Tagami et al. |
| 2020/0185408 | A1 | 6/2020 | Song et al. |

FOREIGN PATENT DOCUMENTS

| | | |
|---|---|---|
| CN | 107810554 A | 3/2018 |
| CN | 108511454 A | 9/2018 |
| CN | 108538841 A | 9/2018 |
| CN | 108831887 A | 11/2018 |
| CN | 108987405 A | 12/2018 |
| CN | 109314118 A | 2/2019 |
| CN | 109346477 A | 2/2019 |
| CN | 109690776 A | 4/2019 |
| CN | 109698201 A | 4/2019 |
| CN | 109727995 A | 5/2019 |
| CN | 109786382 A | 5/2019 |
| CN | 110112134 A | 8/2019 |
| WO | 2019022814 A1 | 1/2019 |

OTHER PUBLICATIONS

Written Opinion of the International Searching Authority issued in corresponding International Application No. PCT/CN2019/102133, dated Mar. 20, 2020, 5 page.
International Search Report issued in corresponding International Application No. PCT/CN2019/102116, dated Mar. 18, 2020, 4 page.
Written Opinion of the International Searching Authority issued in corresponding International Application No. PCT/CN2019/102116, dated Mar. 18, 2020, 5 page.
International Search Report issued in corresponding International Application No. PCT/CN2019/102121, dated Mar. 18, 2020, 5 page.
Written Opinion of the International Searching Authority issued in corresponding International Application No. PCT/CN2019/102121, dated Mar. 18, 2020, 5 page.
International Search Report issued in corresponding International Application No. PCT/CN2019/102114, dated Mar. 25, 2020, 4 pages.
Written Opinion of the International Searching Authority issued in corresponding International Application No. PCT/CN2019/102114, dated Mar. 25, 2020, 5 pages.
Machine-generated English translation of CN108538841, total pp. 12 (Year: 2018).

* cited by examiner

150

700

800

<u>1310</u>

<u>1320</u>

THREE-DIMENSIONAL MEMORY DEVICE WITH SUPPORT STRUCTURES IN GATE LINE SLITS AND METHODS FOR FORMING THE SAME

CROSS-REFERENCE TO RELATED APPLICATIONS

This application is continuation of International Application No. PCT/CN2019/102121, filed on Aug. 23, 2019, entitled "THREE-DIMENSIONAL MEMORY DEVICE WITH SUPPORT STRUCTURES IN GATE LINE SLITS AND METHODS FOR FORMING THE SAME," which claims the benefit of priority to Chinese Patent Application No. 201910522007.2 filed on Jun. 17, 2019, both of which are incorporated herein by reference in their entireties. This application is also related to U.S. application Ser. No. 16/670,571, filed on Oct. 31, 2019, entitled "METHODS FOR FORMING THREE-DIMENSIONAL MEMORY DEVICE WITH SUPPORT STRUCTURE AND RESULTING THREE-DIMENSIONAL MEMORY DEVICE," U.S. application Ser. No. 16/670,579, filed on Oct. 31, 2019, entitled "THREE-DIMENSIONAL MEMORY DEVICE WITH SUPPORT STRUCTURES IN SLIT STRUCTURES AND METHOD FOR FORMING THE SAME," and U.S. application Ser. No. 16/670,586, filed on Oct. 31, 2019, entitled "THREE-DIMENSIONAL MEMORY DEVICE WITHOUT GATE LINE SLITS AND METHOD FOR FORMING THE SAME," all of which are hereby incorporated by reference in their entireties.

BACKGROUND

Embodiments of the present disclosure relate to three-dimensional (3D) memory devices with support structures in gate line slits (GLSs), and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a memory stack having interleaved a plurality of conductor layers and a plurality of insulating layers extending laterally in the memory stack. The 3D memory device also includes a plurality of channel structures extending vertically through the memory stack into the substrate, the plurality of channel structures and the plurality of conductor layers intersecting with one another and forming a plurality of memory cells. The 3D memory device further includes at least one slit structure extending vertically and laterally in the memory stack and dividing the plurality of memory cells into at least one memory block, the at least one slit structure each including a plurality of slit openings and a support structure between adjacent slit openings. The support structure may be in contact with adjacent memory blocks and contacting the substrate. The 3D memory device further includes a source structure having an insulating spacer in each of the plurality of slit openings and a source contact in a respective insulating spacer.

In another example, a method for forming a 3D memory device is provided. The method includes forming a dielectric stack including interleaved a plurality of initial insulating layers and a plurality of initial sacrificial layers over a substrate, and forming at least one slit structure extending vertically and laterally in the dielectric stack and dividing the dielectric stack into a plurality of block regions. The at least one slit structure each includes a plurality of slit openings exposing the substrate and an initial support structure between adjacent slit openings. Each of the plurality of block regions may include interleaved a plurality of insulating layers and a plurality of sacrificial layers, and the initial support structure may include interleaved plurality of insulating portions and sacrificial portions. Each of the plurality of insulating portions and sacrificial portions may be in contact with respective insulating layers and sacrificial layers of a same level from adjacent block regions. In some embodiments, the method also includes forming a plurality of channel structures extending vertically through the dielectric stack, replacing the plurality of sacrificial layers and the plurality of sacrificial portions with a plurality of conductor layers and a plurality of conductor portions through the at least one slit structure, and forming a source structure in each slit structure. The source structure may include an insulating spacer in each of the plurality of slit openings and a source contact in a respective insulating spacer.

In a different example, a method for forming a 3D memory device is provided. The method includes forming a dielectric stack of interleaved plurality of initial insulating layers and plurality of initial sacrificial layers over a substrate, forming a dielectric structure extending along a lateral direction in the dielectric stack, the dielectric structures extending vertically into a first initial insulating layer, and patterning the dielectric stack using the dielectric structure as an etch mask to form a slit structure extending vertically and laterally in the dielectric stack and dividing the dielectric stack into a pair of block regions. The slit structure may include a plurality of slit openings exposing the substrate and a plurality of initial support structure between adjacent slit openings. Each of the plurality of block regions may include interleaved a plurality of insulating layers and sacrificial layers, and each of the plurality of initial support structure may include interleaved a plurality of insulating portions and a plurality of sacrificial portions. Each of the plurality of insulating portions and sacrificial portions may be in contact with respective insulating layers and sacrificial layers of a same level from adjacent block regions. The method may also include forming a plurality of channel structures extending vertically through the dielectric stack, replacing the plurality of sacrificial layers and the plurality of sacrificial portions with a plurality of conductor layers and a plurality of conductor portions through the at least one slit structure, and forming a source structure in each slit structure. The source structure may include an insulating spacer in each of the plurality of slit openings and a source contact in a respective insulating spacer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
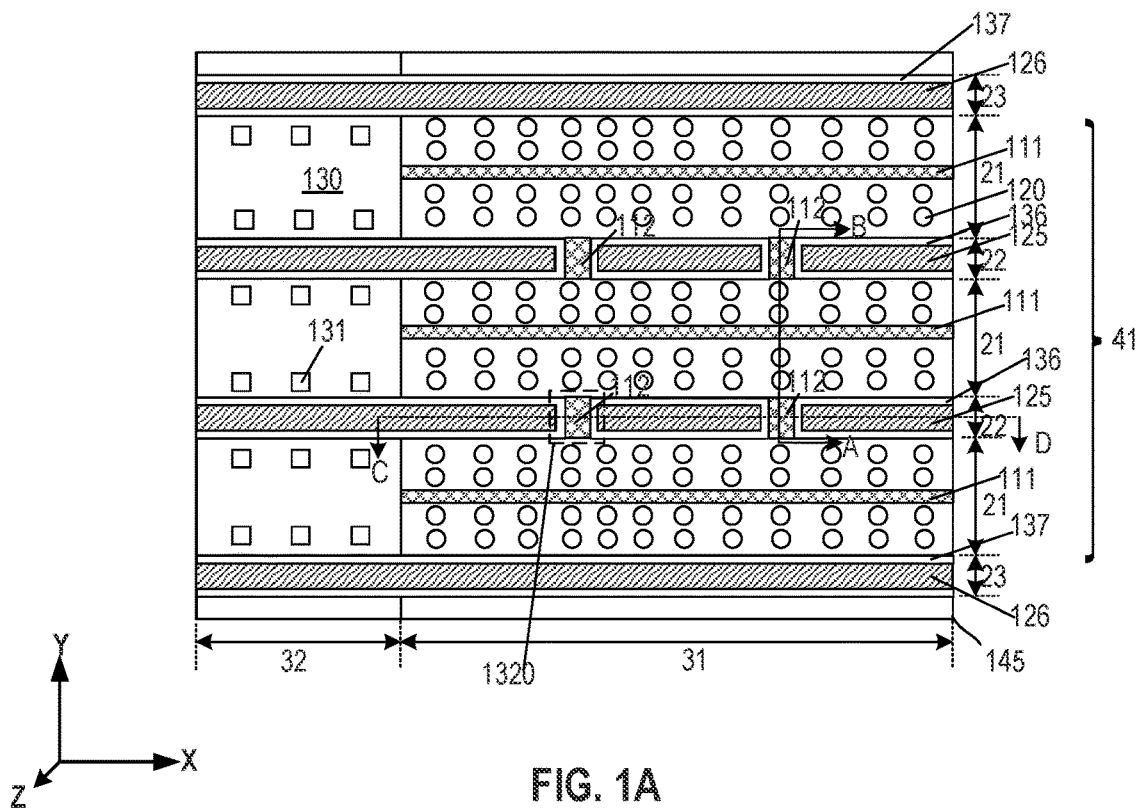
FIG. 1A illustrates a plan view of an exemplary 3D memory device with support structures in GLSs, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile light weighted, of low power consumption and good performance Currently, planar NAND flash memory devices have reached its storage limit. To further increase the storage capacity and reduce the storage cost per bit, 3D NAND memory devices have been proposed. The process to form an existing 3D NAND memory device often includes the following operations. First, a stack structure of a plurality of interleaved sacrificial layers and insulating layers are formed over a substrate. A channel hole is formed extending in the stack structure. The bottom of the channel hole is etched to form a recess in the substrate. An epitaxial portion is formed at the bottom of the channel hole by selective epitaxial growth. A semiconductor channel, conductively connected to the epitaxial portion, is formed in the channel hole. The sacrificial layers can be removed and replaced with conductor layers. The conductor layers function as word lines in the 3D NAND memory device.

An existing 3D NAND memory device often includes a plurality of memory blocks.

Adjacent memory blocks are often separated by a GLS, in which an array common source (ACS) is formed. In the fabrication method to form the existing 3D NAND memory device, the feature size of the GLS is susceptible to fluctuation, potentially affecting the performance of the 3D NAND memory device.

The present disclosure provides 3D memory devices (e.g., 3D NAND memory devices) with support structures in a slit structure (e.g., GLS), and methods for forming the 3D memory devices. A 3D memory device employs one or more support structures that divide a slit structure into a plurality of slit openings, in which source contacts are formed. The support structures are each in contact with adjacent memory blocks, providing support to the entire structure of the 3D memory device during the formation of conductor layers/portions and source contacts. The 3D memory device is then less susceptible to deformation or damages during the fabrication process. The support structures each includes a dividing structure and a plurality of interleaved conductor portions and insulating portions under the dividing structure. The dividing structure may extend across and connecting the adjacent memory blocks in the top portion of the memory stack, and the plurality of interleaved conductor portions and insulating portions may be respectively in contact with interleaved conductor layers and insulating layers of adjacent memory blocks. In some embodiments, the conductor portions of the support structure and the conductor layers of adjacent memory blocks are formed by the same deposition process. By applying the structures and methods of the present disclosure, adjacent memory blocks are connected through the support structures during the formation of slit structures and source contacts, the 3D memory device is thus less likely to deform during the fabrication process. The feature size of the slit structure is less susceptible to fluctuation.

Figure 1B:
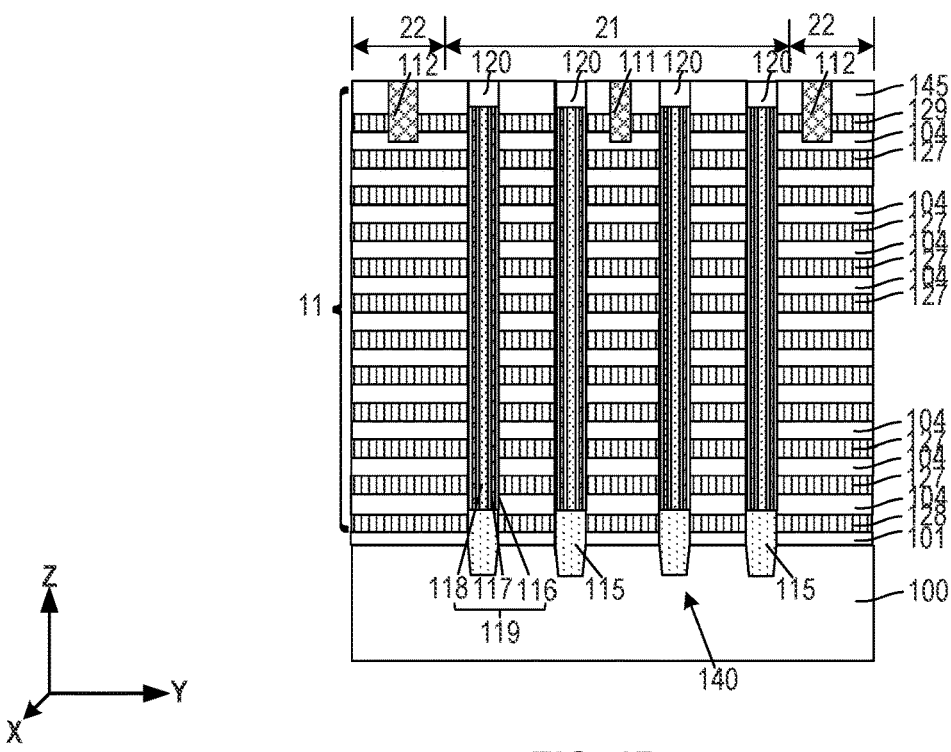
FIG. 1B illustrates a cross-sectional view of the 3D memory device illustrated in FIG. 1A along the A-B direction, according to some embodiments of the present disclosure.
Figure 1C:
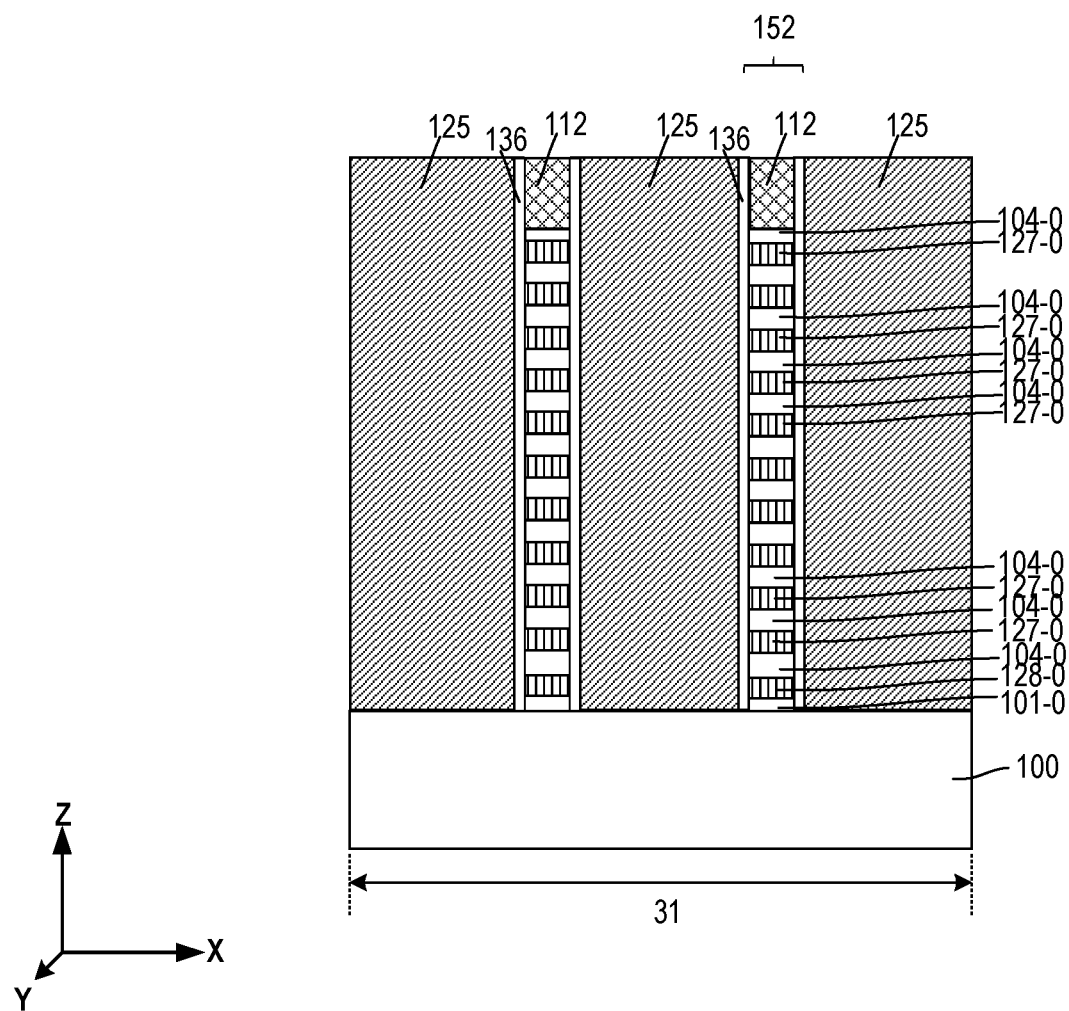
FIG. 1C illustrates a cross-sectional view of the 3D memory device illustrated in FIG. 1A along the C-D direction, according to some embodiments of the present disclosure.
Figure 3A:
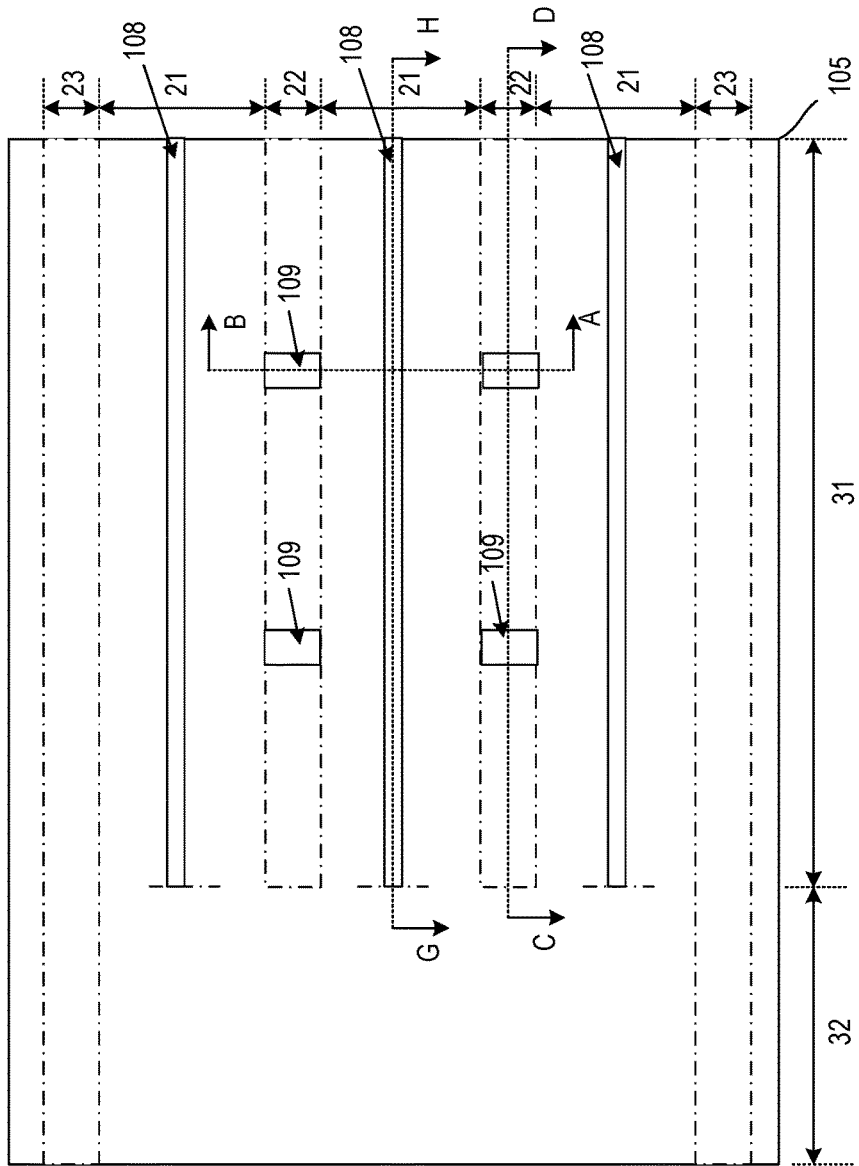
FIG. 3A illustrates a plan view of the exemplary 3D memory device at another stage of the fabrication process, according to some embodiments of the present disclosure.
Figure 3B:
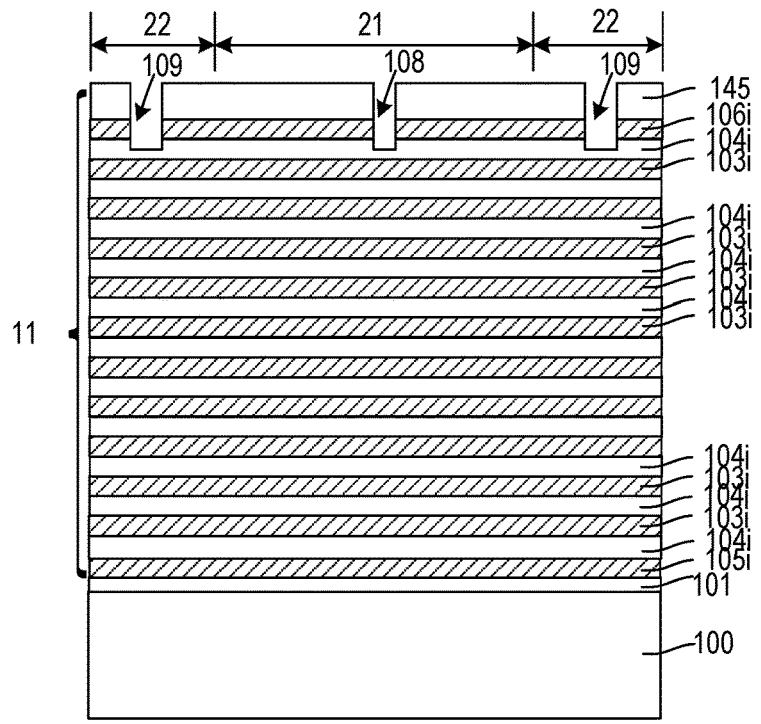
FIG. 3B illustrates a cross-sectional view of the 3D memory device illustrated in FIG. 3A along the A-B direction, according to some embodiments of the present disclosure.
Figure 3C:
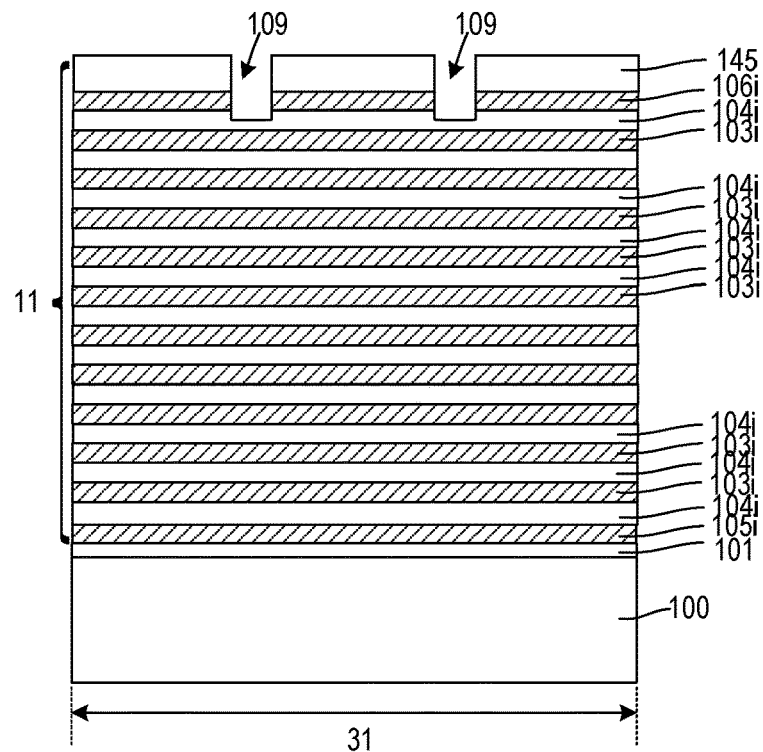
FIG. 3C illustrates a cross-sectional view of the 3D memory device illustrated in FIG. 3A along the C-D direction, according to some embodiments of the present disclosure.
Figure 3D:
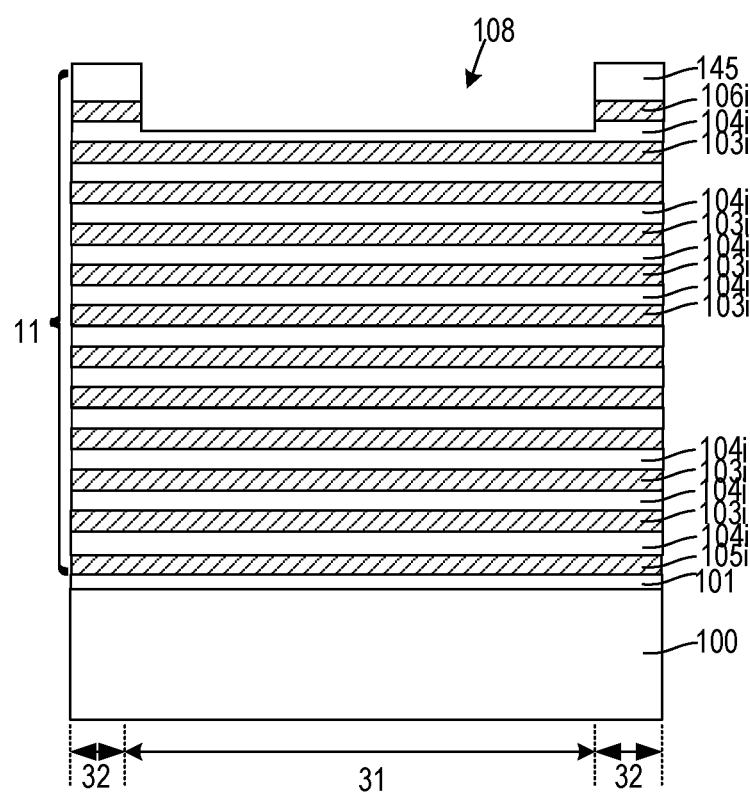
FIG. 3D illustrates a cross-sectional view of the 3D memory device illustrated in FIG. 3A along the G-H direction, according to some embodiments of the present disclosure.
Figure 3D:
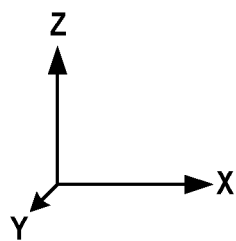
Figure 4A:
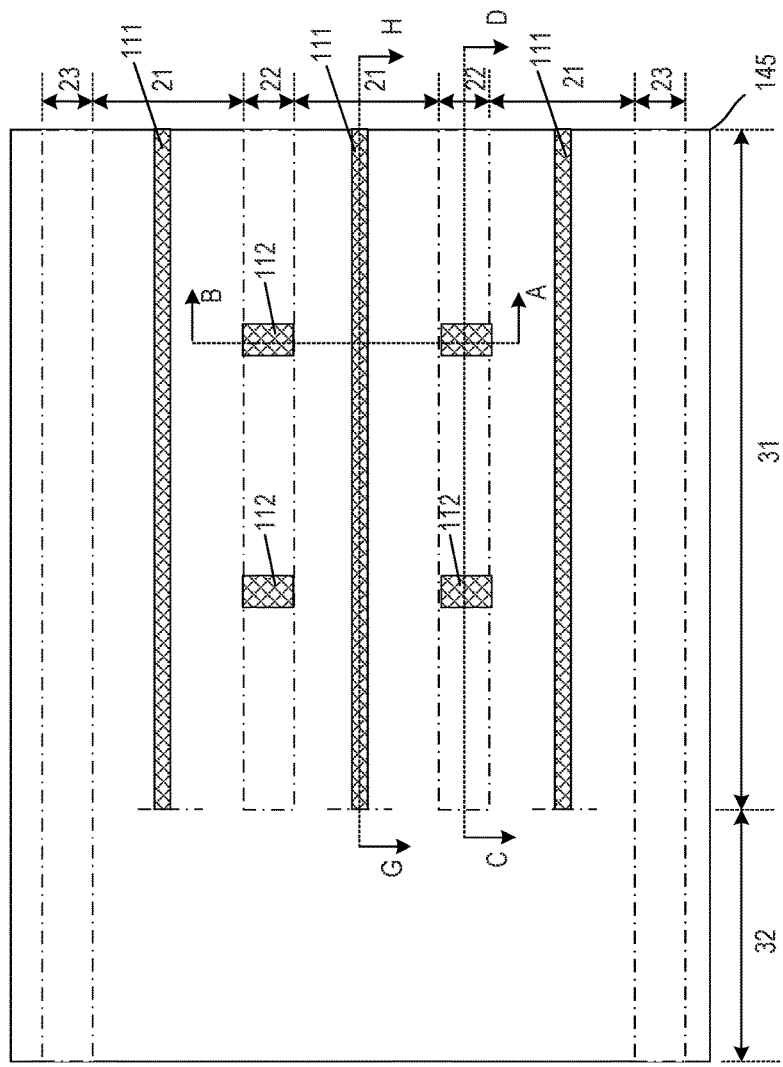
FIG. 4A illustrates a plan view of the exemplary 3D memory device at another stage of the fabrication process, according to some embodiments of the present disclosure.
Figure 4B:
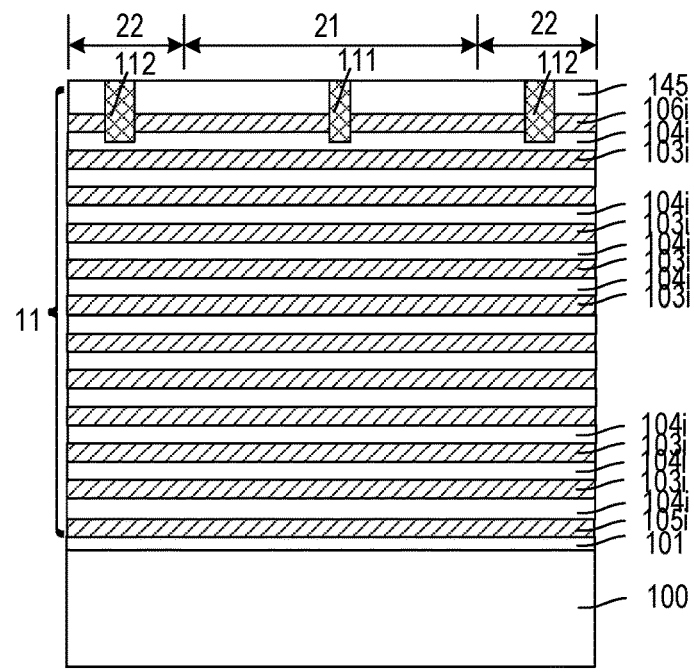
FIG. 4B illustrates a cross-sectional view of the 3D memory device illustrated in FIG. 4A along the A-B direction, according to some embodiments of the present disclosure.
Figure 4C:
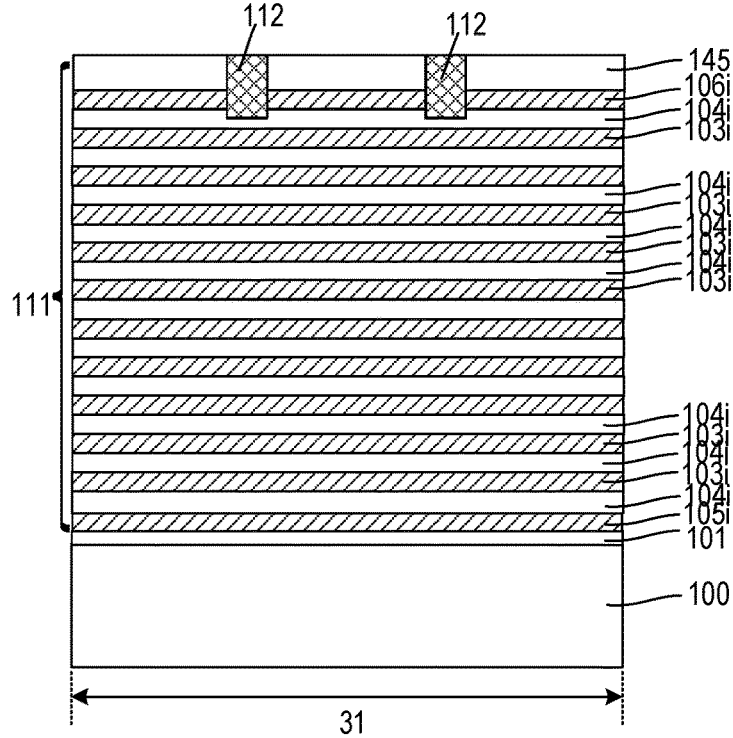
FIG. 4C illustrates a cross-sectional view of the 3D memory device illustrated in FIG. 4A along the C-D direction, according to some embodiments of the present disclosure.
Figure 4D:
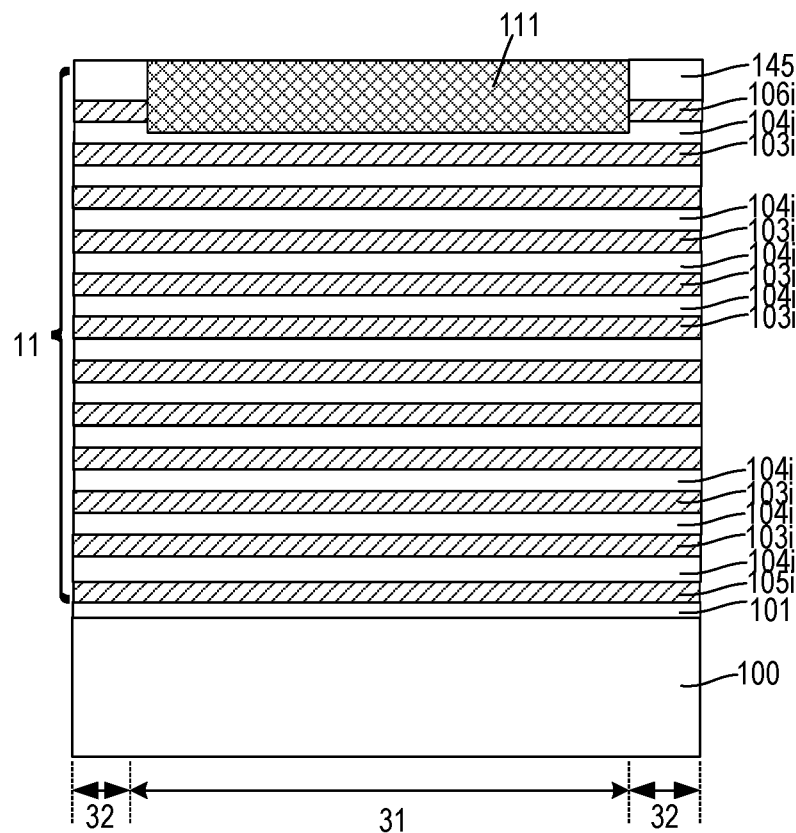
FIG. 4D illustrates a cross-sectional view of the 3D memory device illustrated in FIG. 4A along the G-H direction, according to some embodiments of the present disclosure.
Figure 4D:
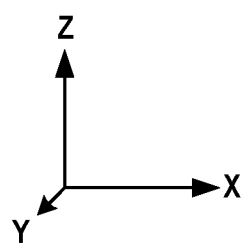

FIG. 1A illustrates a plan view of an exemplary 3D memory device 150, according to some embodiments. FIG. 1B illustrates a cross-sectional view of the 3D memory device 150 shown in FIG. 1A along the A-B direction. FIG. 1C illustrates a cross-sectional view of the 3D memory device 150 shown in FIG. 1A along the C-D direction. As shown in FIG. 1A, 3D memory device 150 may be divided into a core region 31 and a staircase region 32, e.g., along the y-direction. Channel structures and support pillars can be formed in core region 31. Staircases and electric connection between conductor layers and outside circuits (e.g., contact plugs) can be formed in staircase region 32. Core region 31 may include one or more, e.g., a pair of, first source regions 23 extending along the x-direction. A first source structure may be formed in each first source region 23. A channel region 41, in which a plurality of channel structures and memory cells are formed, may be located between adjacent first source regions 23. In some embodiments, channel region 41 may be divided into a plurality of block regions 21 by one or more second source regions 22 extending along the x-direction. A memory block may be formed in each block region 21, and a second source structure may be formed in each second source regions 22.

As shown in FIGS. 1A-1C, 3D memory device 150 may include a substrate 100, a buffer oxide layer 101, and a stack structure 11 over buffer oxide layer 101. In block regions 21, stack structure 11 may include a plurality of conductor layers and a plurality of insulating layers 104 interleaved over buffer oxide layer 101. In some embodiments, the plurality of conductor layers may include a top conductor layer 129 having a plurality of top select conductor layers, a bottom conductor layer 128 having a plurality of bottom select conductor layers, and control conductor layers 127 between top conductor layer 129 and bottom conductor layer 128. Stack structure 11 may also include a dielectric cap layer 145 covering the plurality of conductor layers (i.e., 127-129) and insulating layers 104. In block regions 21, stack structure 11 may also include a plurality of channel structures 140 extending from a top surface of dielectric cap layer 145 into substrate 100 along a vertical direction (e.g., the z-direction). Each channel structure 140 may include an epitaxial portion 115 at a bottom portion, a drain structure 120 at a top portion, and a semiconductor channel 119 between epitaxial portion 115 and drain structure 120. Semiconductor channel 119 may include a memory film 116, a semiconductor layer 117, and a dielectric core 118. Epitaxial portion 115 may contact and be conductively connected to substrate 100, and semiconductor channel 119 may contact and be conductively connected to drain structure 120 and epitaxial portion 115. A plurality of memory cells may be formed by semiconductor channels 119 and control conductor layers 127. In staircase region 32, stack structure 11 may include a plurality of contact plugs 131 in an insulator 130 and each in contact with a respective conductor layer (e.g., 127, 128, or 129) and a peripheral circuit (not shown). Contact plugs 131 may apply a word line voltage on the connected conductor layers.

A first source structure may be formed in first source region 23 to extend along the x-direction in core region 31 and staircase region 32. The first source structure may include a source contact 126 in an insulating structure 137. A second source structure may be formed in second source region 22 to extend along the x-direction in core region 31 and staircase region 32. The second source structure may include a plurality of source contacts 125 each in a respective insulating structure 136. Source contacts 125 and respective insulating structures 136 formed in one second source region 22 (e.g., of the same second source structure) may be aligned along the x-direction. The first and second source structures may each extend vertically through stack structure 11 and contact substrate 100, applying a source voltage on the memory cells through substrate 100. 3D memory device 150 may include one or more support structures 152 aligned along the x-direction and dividing a second source structure into the plurality of source contacts 125 each in the respective insulating structure 136. In some embodiments, support structure 152 includes a dividing structure 112 connecting adjacent memory blocks (or block regions 21) and a plurality of interleaved conductor portions (e.g., 127-0 and 128-0) and insulating portions 104-0 under dividing structure 112. Support structure 152 may provide support to 3D memory device 150 during the formation of the second source structures and conductor layers (e.g., 127-129). In some embodiments, one or more cut structures 111 may be formed extending in parallel with the first source structures and the second source structures in channel region 41. Cut structures 111 may divide top conductor layer 129 into a plurality of top select conductor layers, functioning as top select gate electrodes.

Substrate 100 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 100 is a thinned substrate (e.g., a semiconductor layer), which was thinned by grinding, etching, chemical mechanical polishing (CMP), or any combination thereof. In some embodiments, substrate 100 includes silicon.

Channel structures 140 may form an array and may each extend vertically above substrate 100. Channel structure 140 may extend through a plurality of pairs each including a conductor layer (e.g., 127, 128, or 129) and an insulating layer 104 (referred to herein as "conductor/insulating layer pairs"). In some embodiments, buffer oxide layer 101 is formed between substrate 100 and stack structure 11. At least on one side along a horizontal direction (e.g., x-direction and/or y-direction), stack structure 11 can include a staircase structure, e.g., in staircase region 32. The number of the conductor/insulating layer pairs in stack structure 11 (e.g., 32, 64, 96, or 128) determines the number of memory cells in 3D memory device 150. In some embodiments, conductor layers (e.g., 127-129) and insulating layers 104 in stack structure 11 are alternatingly arranged along the vertical direction in block regions 21. Conductor layers (e.g., 127-129) can include conductive materials including, but not limited to, tungsten (W), cobalt (Co), copper (Cu), aluminum (Al), polysilicon, doped silicon, silicides, or any combination thereof. Insulating layers 104 can include dielectric materials including, but not limited to, silicon oxide, silicon nitride, silicon oxynitride, or any combination thereof. In some embodiments, buffer oxide layer 101 and dielectric cap layer 145 each includes a dielectric material such as silicon oxide. In some embodiments, top conductor layer 129 includes a plurality of top select conductor layers, which function as the top select gate electrodes. Control conductor layers 127 may function as select gate electrodes and form memory cells with intersecting channel structures 140. In some embodiments, bottom conductor layer 128 includes a plurality of bottom select conductor layers, which function as the bottom select gate electrodes. Top select gate electrodes and bottom select gate electrodes can respectively be applied with desired voltages to select a desired memory block/finger/page.

As shown in FIG. 1B, channel structure 140 can include a semiconductor channel 119 extending vertically through stack structure 11. Semiconductor channel 119 can include a channel hole filled with a channel-forming structure, e.g., semiconductor materials (e.g., as a semiconductor layer 117) and dielectric materials (e.g., as a memory film 116). In some embodiments, semiconductor layer 117 includes silicon, such as amorphous silicon, polysilicon, or single crystalline silicon. In some embodiments, memory film 116 is a composite layer including a tunneling layer, a memory layer (also known as a "charge trap layer"), and a blocking layer. The remaining space of the channel hole of semiconductor channel 119 can be partially or fully filled with a dielectric core 118 including dielectric materials, such as silicon oxide. Semiconductor channel 119 can have a cylinder shape (e.g., a pillar shape). Dielectric core 118, semiconductor layer 117, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 140 further includes an epitaxial portion 115 (e.g., a semiconductor plug) in the lower portion (e.g., at the lower end of bottom) of channel structure 140. As used herein, the "upper end" of a component (e.g., channel structure 140) is the end farther away from substrate 100 in the vertical direction, and the "lower end" of the component (e.g., channel structure 140) is the end closer to substrate 100 in the vertical direction when substrate 100 is positioned in the lowest plane of 3D memory device 150. Epitaxial portion 115 can include a semiconductor material, such as silicon, which is epitaxially grown from substrate 100 in any suitable directions. It is understood that in some embodiments, epitaxial portion 115 includes single crystalline silicon, the same material as substrate 100. In other words, epitaxial portion 115 can include an epitaxially-grown semiconductor layer grown from substrate 100. Epitaxial portion 115 can also include a different material than substrate 100. In some embodiments, epitaxial portion 115 includes at least one of silicon, germanium, and silicon germanium. In some embodiments, part of epitaxial portion 115 is above the top surface of substrate 100 and in contact with semiconductor channel 119. Epitaxial portion 115 may be conductively connected to semiconductor channel 119. In some embodiments, a top surface of epitaxial portion 115 is located between a top surface and a bottom surface of a bottom insulating layer 104 (e.g., the insulating layer at the bottom of stack structure 11).

In some embodiments, channel structure 140 further includes drain structure 120 (e.g., channel plug) in the upper portion (e.g., at the upper end) of channel structure 140. Drain structure 120 can be in contact with the upper end of semiconductor channel 119 and may be conductively connected to semiconductor channel 119. Drain structure 120 can include semiconductor materials (e.g., polysilicon) or conductive materials (e.g., metals). In some embodiments, drain structure includes an opening filled with Ti/TiN or Ta/TaN as an adhesion layer and tungsten as a conductor material. By covering the upper end of semiconductor channel 119 during the fabrication of 3D memory device 150, drain structure 120 can function as an etch stop layer to prevent etching of dielectrics filled in semiconductor channel 119, such as silicon oxide and silicon nitride.

As shown in FIG. 1A, first source region 23 and second source region 22 may divide channel region 41 into a plurality of block regions 21, which can further be divided to form a plurality of memory fingers by one or more cut structures 111. A plurality of channel structures 140 (e.g., memory cells) can be formed in each memory block/finger. In some embodiments, first source regions 23, second source regions 22, and cut structures 111 may extend along the x-direction. In some embodiments, cut structures 111 may extend along the x-direction in channel region 41, and first and second source regions 23 and 22 may extend laterally in core region 31 and staircase region 32. The number of cut structures 111 in a block region 21 (i.e., memory block) may range from 0 to n, n being a suitable positive integer. The number of n should be determined based on the design and/or fabrication of 3D memory device 150 and should not be limited by the embodiments of the present disclosure. For illustrative purposes, n is equal to 1 in the present disclosure.

In some embodiments, cut structure 111 includes a suitable dielectric material, such as one or more of silicon oxide, silicon nitride, and silicon oxynitride, and divides the respective block region 21 (or memory block) into a pair of memory fingers. Specifically, cut structure 111 may extend vertically (e.g., along the z-direction) into the top insulating layer 104 (i.e., the insulating layer 104 under top conductor layer 129). In some embodiments, a bottom surface of cut structure 111 is between a top surface and a bottom surface of top insulating layer 104. In some embodiments, cut structure 111 divides top conductor layer 129 into a plurality of top select conductor layers. A voltage can be applied on one or more top select conductor layers to select a desired memory finger/page/block.

In some embodiments, a first source structure includes a source contact 126 in an insulating structure 137, extending along the x-direction. Source contact 126 may be in contact with and form a conductive connection with substrate 100 for applying a source voltage on memory cells. In some embodiments, source contact 126 includes one or more of polysilicon, silicides, germanium, silicon germanium, copper, aluminum, cobalt, and tungsten. In some embodiments, insulating structure 137 includes one or more of silicon oxide, silicon nitride, and silicon oxynitride. In some embodiments, insulator 130 includes a suitable dielectric material such as silicon oxide, silicon nitride, and/or silicon oxynitride. In some embodiments, contact plugs 131 are each in contact with and conductively connected to a respective conductor layer (e.g., 127, 128, or 129). Contact plugs 131 may include one or more of polysilicon, silicides, germanium, silicon germanium, copper, aluminum, cobalt, and tungsten.

In some embodiments, a second source structure includes a plurality of source contacts 125 each in a respective insulating structure 136. The materials of source contacts 125 and insulating structures 136 may be similar to or the same as source contacts 126 and insulating structures 137, and the description is thus not repeated herein. At least one support structure 152 may be formed between a pair of source contacts 125 (and a pair of insulating structures 136) and in contact with adjacent block regions 21 (or memory blocks). As shown in FIGS. 1B and 1C, support structure 152 may include a dividing structure 112 and a plurality of interleaved conductor portions (e.g., 127-0 and 128-0) and insulating portions 104-0 under dividing structure 112. Conductor portions (e.g., 127-0 and 128-0) and insulating portions 104-0 may respectively be in contact with (e.g., connected to) conductor layers (e.g., 127 and 128) and insulating layers 104 of the same level in adjacent block regions 21 (or memory blocks) along the y-direction. In some embodiments, conductor portions (e.g., 127-0 and 128-0) and insulating portions 104-0 are disconnected from conductor layers (e.g., 127 and 128) and insulating layers 104 of any block regions 21 (or memory blocks) in respective second source region 22 along the x-direction. In some embodiments, 3D memory device 150 includes a plurality of support structures 152 aligned along the x-direction to divide the second source structure into a plurality of source contacts 125, each in the respective insulating structure 136. As shown in FIGS. 1A-1C, the plurality of support structures 152 may divide the second source structure into a plurality of disconnected source contacts 125 and insulating structures 136 along the x-direction. The plurality of support structures 152 may also connect conductor layers (e.g., 127 and 128) and insulating layers 104 of adjacent block regions 21 along the y-direction. In some embodiments, support structures 152 may be formed in channel region 41.

In some embodiments, dividing structure 112 includes a suitable material that has sufficient stiffness and strength and can be used as an etch mask for the formation of slit structure before the formation of second source structure. The material of dividing structure 112 may also sustain the gate replacement process for the formation of conductor layers (e.g., 127-129) and conductor portions (e.g., 127-0 and 128-0). In some embodiments, dividing structure 112 includes one or more of silicon oxide, silicon nitride, and/or silicon oxynitride. In some embodiments, dividing structure 112 and cut structure 111 may include the same material, e.g., silicon oxide. In some embodiments, conductor portions (e.g., 127-0 and 128-0) and insulating portions 104-0 may include the same material as respective conductor layers (e.g., 127 and 128) and insulating layers 104 of the same level in adjacent block regions 21 (or memory blocks). In some embodiments, a bottom surface of dividing structure 112 is between a top surface and a bottom surface of top insulating layer 104. In some embodiments, a depth of dividing structure 112 and a depth of cut structure 111 may be the same along the z-axis, e.g., from the top surface of dielectric cap layer 145 to a same level in top insulating layer 104.

Figure 13A:
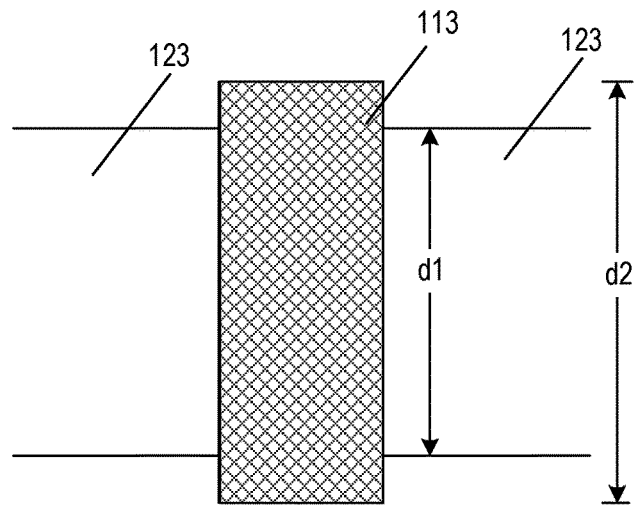
FIG. 13A illustrates an enlarged view of an exemplary initial support structure, according to some embodiments of the present disclosure.
Figure 13A:
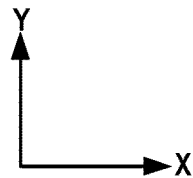
Figure 13B:
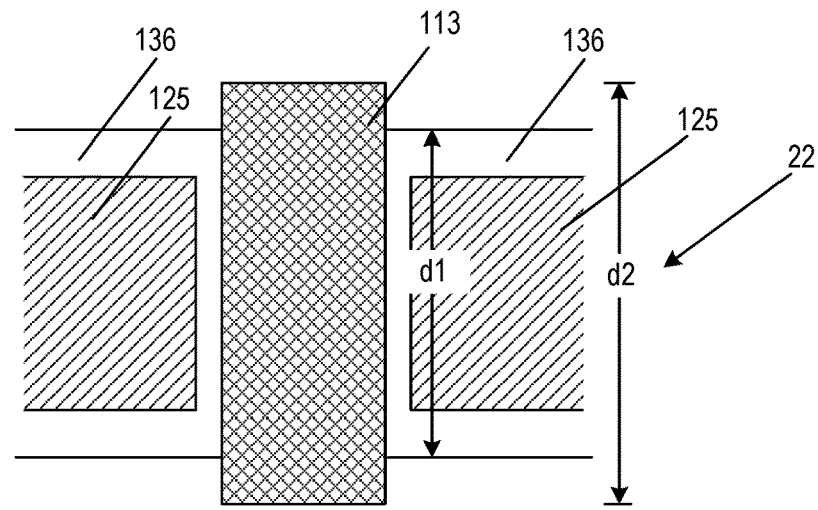
FIG. 13B illustrates an enlarged view of an exemplary support structure, according to some embodiments of the present disclosure.
Figure 13B:
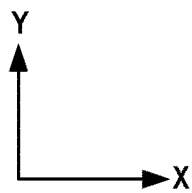

A width of dividing structure 112 along the y-direction may be equal to or greater than the width of second source structure along the y-direction. FIG. 13B illustrates an enlarged plan view 1320 of dividing structure 112, adjacent source contacts 125, and adjacent insulating structures 136. As shown in FIG. 13B, a width d2 of dividing structure 112 along the y-direction is equal to or greater than a width d1 of second source structure (or insulating structure 136) along the y-direction. In some embodiments, d2 is greater than d1. In some embodiments, d2 being equal to or greater than d1 prevents support structure 152 (or interleaved conductor portions (e.g., 127-0 and 128-0) and insulating portions 104-0) from being disconnected from adjacent memory blocks. Details are described as follows.

3D memory device 150 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 150 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 150, such as page buffers, decoders, and latches; not shown) is flipped and faces down toward the memory array device (e.g., NAND memory strings) for hybrid bonding. It is understood that in some embodiments, the memory array device substrate (e.g., substrate 100) is flipped and faces down toward the peripheral device (not shown) for hybrid bonding, so that in the bonded non-monolithic 3D memory device, the memory array device is above the peripheral device. The memory array device substrate (e.g., substrate 100) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 14A:
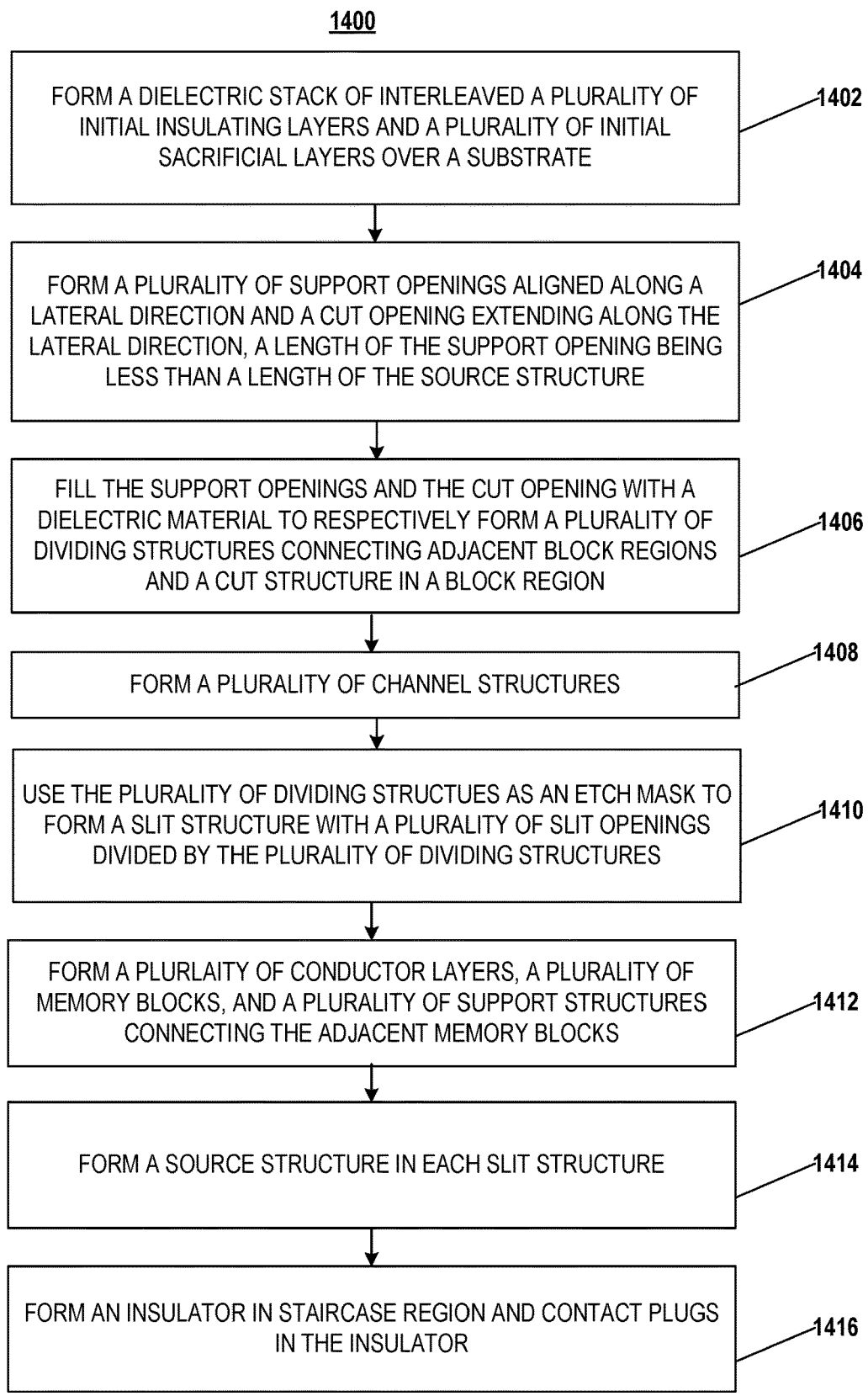
FIG. 14A illustrates a flowchart of an exemplary fabrication process for forming a 3D memory device with support structures in a slit structure, according to some embodiments of the present disclosure.

FIGS. 2-4, 7, and 9-12 illustrate a fabrication process to form 3D memory device 150, and FIG. 14A illustrates a flowchart 1400 of the fabrication process, according to some embodiments.

At the beginning of the process, a stack structure of interleaved a plurality of initial insulating layers and a plurality of initial sacrificial layers are formed (Operation 1402). FIGS. 2A-2D illustrate a corresponding structure 200.

As shown in FIGS. 2A-2D, a stack structure 11 having a dielectric stack of interleaved initial insulating layers 104i and initial sacrificial layers 103i is formed over a substrate 100. Initial sacrificial layers 103i may be used for subsequent formation of control conductor layers 127. Stack structure 11 may also include a top initial sacrificial layer 106i and a bottom initial sacrificial layer 105i respectively for subsequent formation of top conductor layer 129 and bottom conductor layer 128. In some embodiments, stack structure 11 includes a dielectric cap layer 145 over initial sacrificial layers (e.g., 103i, 105i, and 106i) and initial insulating layers 104i. 3D memory device 150 may include a core region 31 for forming channel structures 140 and support pillars (not shown), and a staircase region 32 for forming staircases and contact plugs (e.g., 131) on the staircases. Core region 31 may include a channel region 41 for forming channel structures 140. In some embodiments, channel region 41 may be between first source regions 23. One or more second source regions 22 may subsequently be formed between first source regions 23, and block regions 21 may each be located between first source region 23 and second source region 22 or between second source regions 22.

Figure 2A:
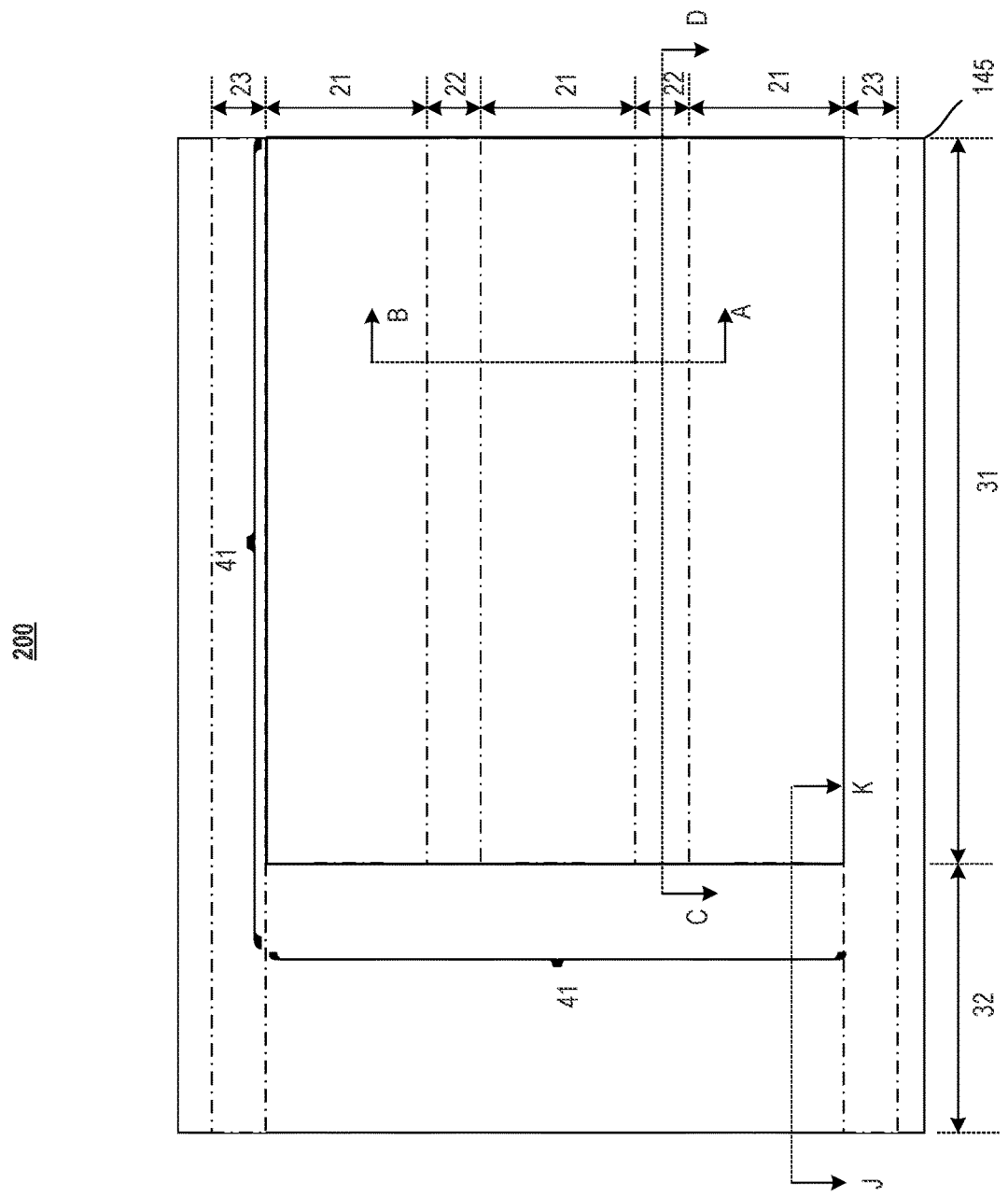
FIG. 2A illustrates a plan view of an exemplary 3D memory device at one stage of a fabrication process, according to some embodiments of the present disclosure.
Figure 2B:
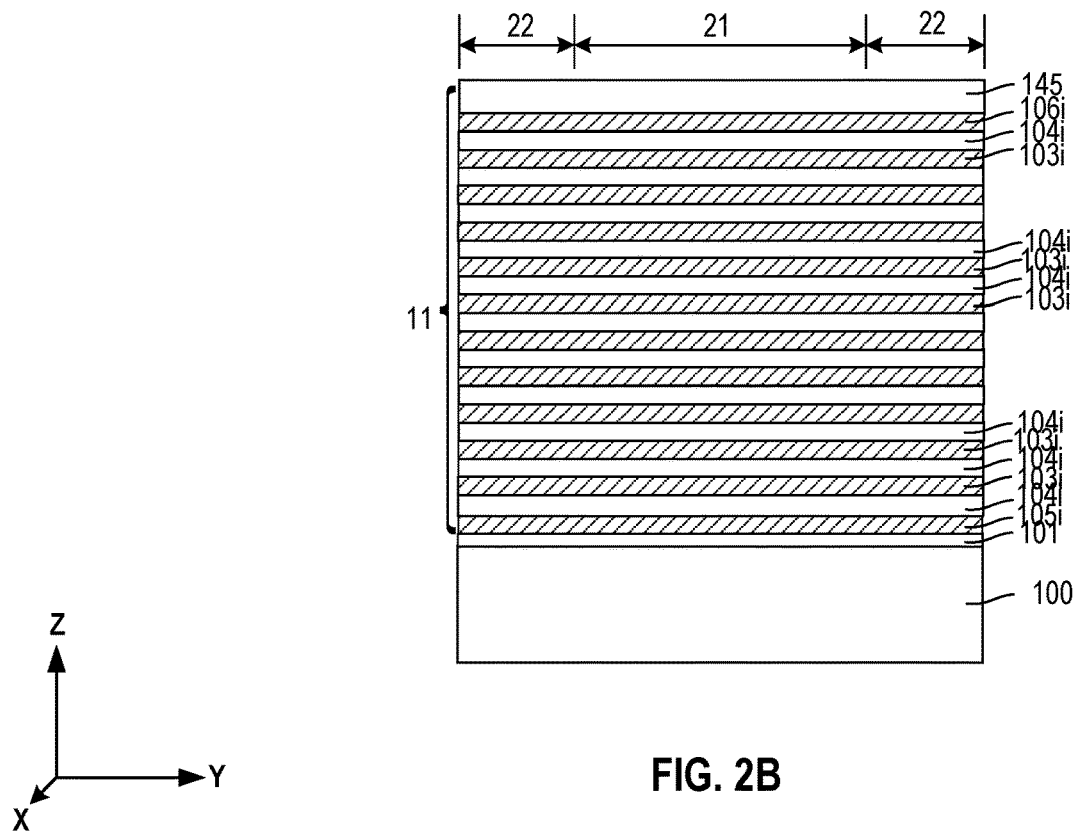
FIG. 2B illustrates a cross-sectional view of the 3D memory device illustrated in FIG. 2A along the A-B direction, according to some embodiments of the present disclosure.
Figure 2C:
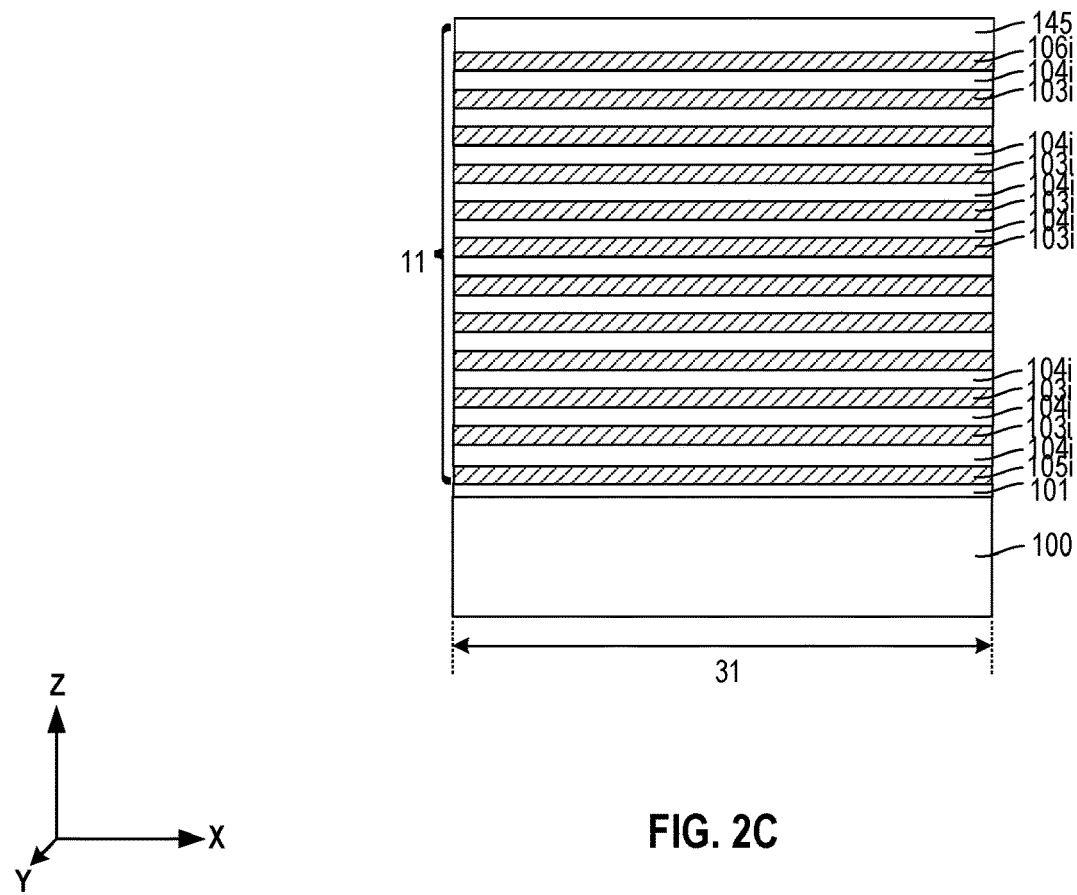
FIG. 2C illustrates a cross-sectional view of the 3D memory device illustrated in FIG. 2A along the C-D direction, according to some embodiments of the present disclosure.
Figure 2D:
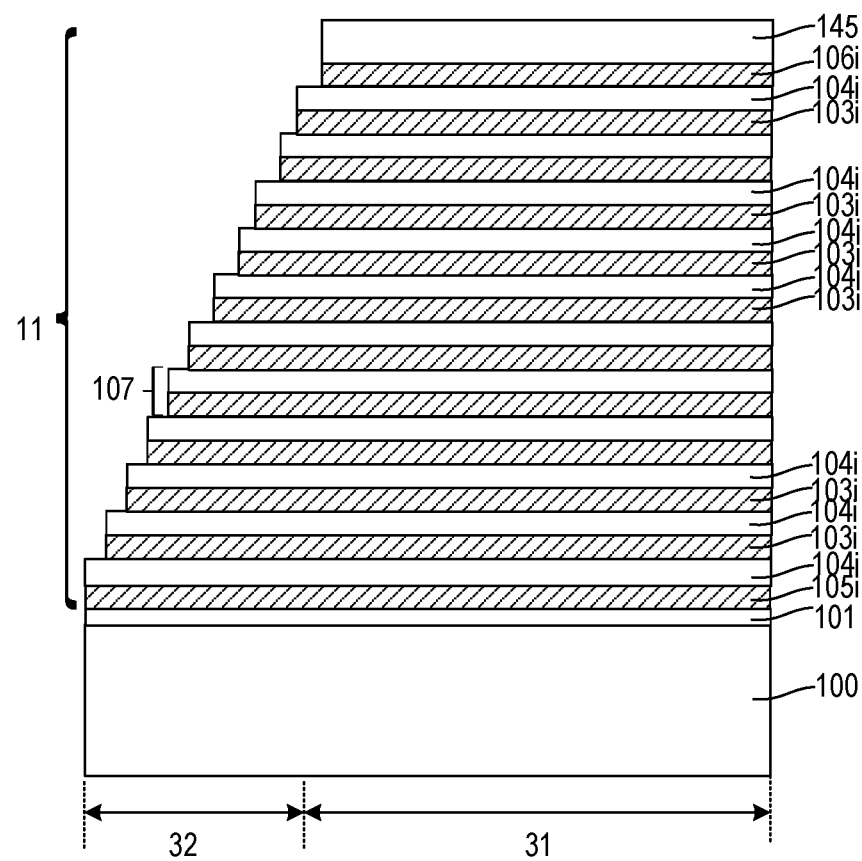
FIG. 2D illustrates a cross-sectional view of the 3D memory device illustrated in FIG. 2A along the J-K direction, according to some embodiments of the present disclosure.

Stack structure 11 may have a staircase structure, as shown in FIG. 2D. The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over buffer oxide layer 101 until a desired number of layers is reached. In some embodiments, a sacrificial material layer is deposited over buffer oxide layer 101, and an insulating material layer is deposited over the sacrificial material layer, so on and so forth. The sacrificial material layers and insulating material layers can have the same or different thicknesses. In some embodiments, a sacrificial material layer and the underlying insulating material layer are referred to as a dielectric pair 107. In some embodiments, one or more dielectric pairs 107 can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair 107 can be etched, after the trimming of the PR layer, using suitable etchants to remove a portion of both the sacrificial material layer and the underlying insulating material layer. The etched sacrificial material layers and insulating material layers may form initial sacrificial layers (e.g., 103i, 105i, and 106i) and initial insulating layers 104i. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), physical vapor deposition (PVD), and sputtering. In some embodiments, the sacrificial material layers include silicon nitride, and the deposition of insulating material layers include one or more of CVD, PVD, ALD, and sputtering. In some embodiments, the etching of the sacrificial material layers and the insulating material layers include one or more suitable anisotropic etching process, e.g., dry etch.

Referring back to FIG. 14A, a plurality of support openings are formed to be aligned along a lateral direction, a length of the support opening being less than a length of the source structure (Operation 1404). Optionally, a cut opening is formed extending along the lateral direction. FIGS. 3A-3D illustrate a corresponding structure 300.

As shown in FIGS. 3A-3D, at least one support opening 109 is formed in second source region 22. In some embodiments, a plurality of support openings 109 are formed in each second source region 22 along the x-direction, separated from one another. Along the x-direction, a length of support opening 109 may be less than a length of the second source structure to be formed (or the length of second source region 22 or the slit structure in which the second source structure is formed). The plurality of support openings 109 may have the same or different dimensions. In some embodiments, the plurality of support openings 109 may have the same shapes and dimensions along the x-y plane, and same depth along the z-direction. Along the y-direction, a width of support opening 109 may be greater than or equal to a width of second source region 22. In some embodiments, a bottom surface of support opening 109 may be between a top surface and a bottom surface of top initial insulating layer 104i (e.g., the initial insulating layer 104i under top initial sacrificial layer 106i). A suitable patterning process, e.g., an etching process, such as a dry etch and/or wet etch, may be performed to form support openings 109.

In some embodiments, one or more cut openings 108 may be formed extending along the x-direction by the same patterning/etching process that form support openings 110. Along the x-direction, a length of cut opening 108 may be the same as a length of channel region 41 (e.g., or core region 31) along the x-direction. One or more cut openings 108 may be formed in one block region 21, depending on, e.g., the number of memory fingers to be formed in a memory block. In some embodiments, a bottom surface of cut opening 108 may be between a top surface and a bottom surface of top initial insulating layer 104i (e.g., the initial insulating layer 104i under top initial sacrificial layer 106i). In some embodiments, a depth of support opening 109 is the same as a depth of cut opening 108 along the vertical direction, e.g., the bottom surfaces of support opening 109 and cut opening 108 being on the same level of top initial insulating layer 104i.

Referring back to FIG. 14A, the support openings are filled with a dielectric material to form the dividing structures that connect adjacent block regions (Operation 1406). Optionally, any cut opening is filled with the dielectric material to form a cut structure in the respective block region. FIGS. 4A-4D illustrate a corresponding structure 400.

As shown in FIGS. 4A-4D, support openings 109 may be filled with a suitable material to form dividing structures 112. Dividing structures 112 may have sufficient stiffness and strength to function as an etch mask for the formation of slit structures before the formation of second source structures. Dividing structure 112 may also sustain the gate replacement process for the formation of conductor layers (e.g., 127-129) and conductor portions (e.g., 127-0 and 128-0). In some embodiments, dividing structure 112 may include a different material than the sacrificial layers so that dividing structure 112 has little or no damages during the gate-replacement process in which the sacrificial layers are etched away. In some embodiments, dividing structure 112 includes one or more of silicon oxide, silicon nitride, and/or silicon oxynitride. Dividing structure 112 can be deposited by a suitable deposition process such as CVD, ALD, PVD, sputtering, or a combination thereof. Optionally, cut openings 108 may be filled with the same material that fills support opening 109, using the same deposition process. Cut structures 111 may be formed extending along the x-direction.

Figure 7A:
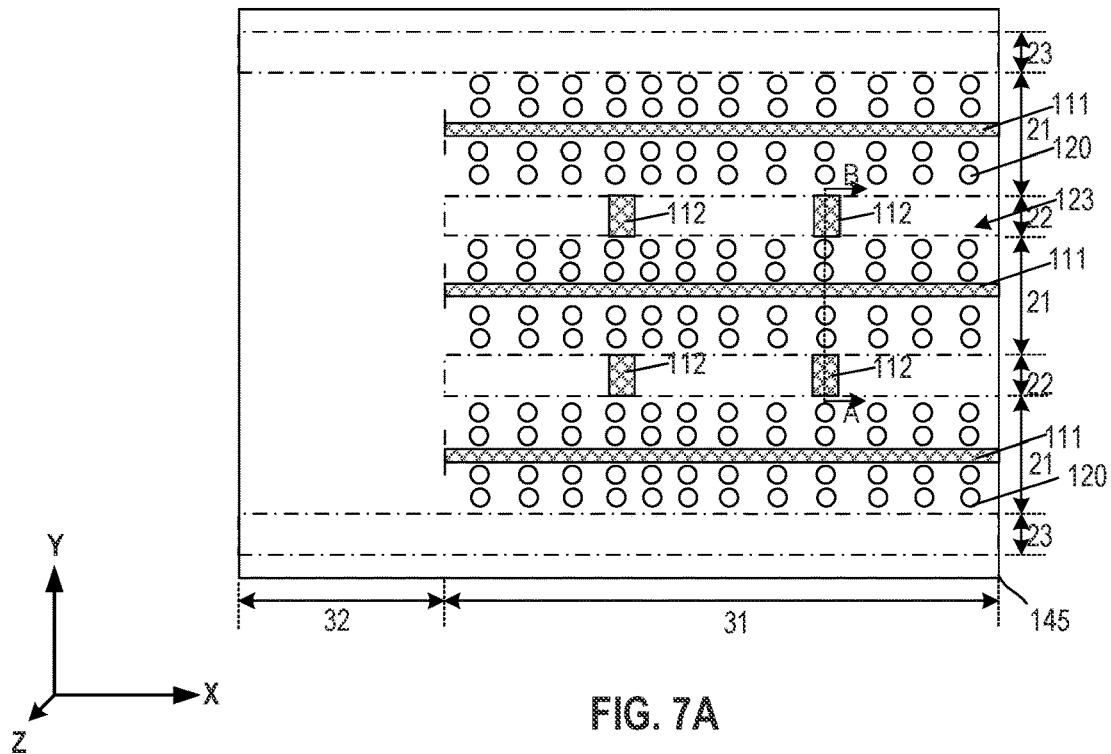
FIG. 7A illustrates a plan view of the exemplary 3D memory device at another stage of the fabrication process, according to some embodiments of the present disclosure.
Figure 7B:
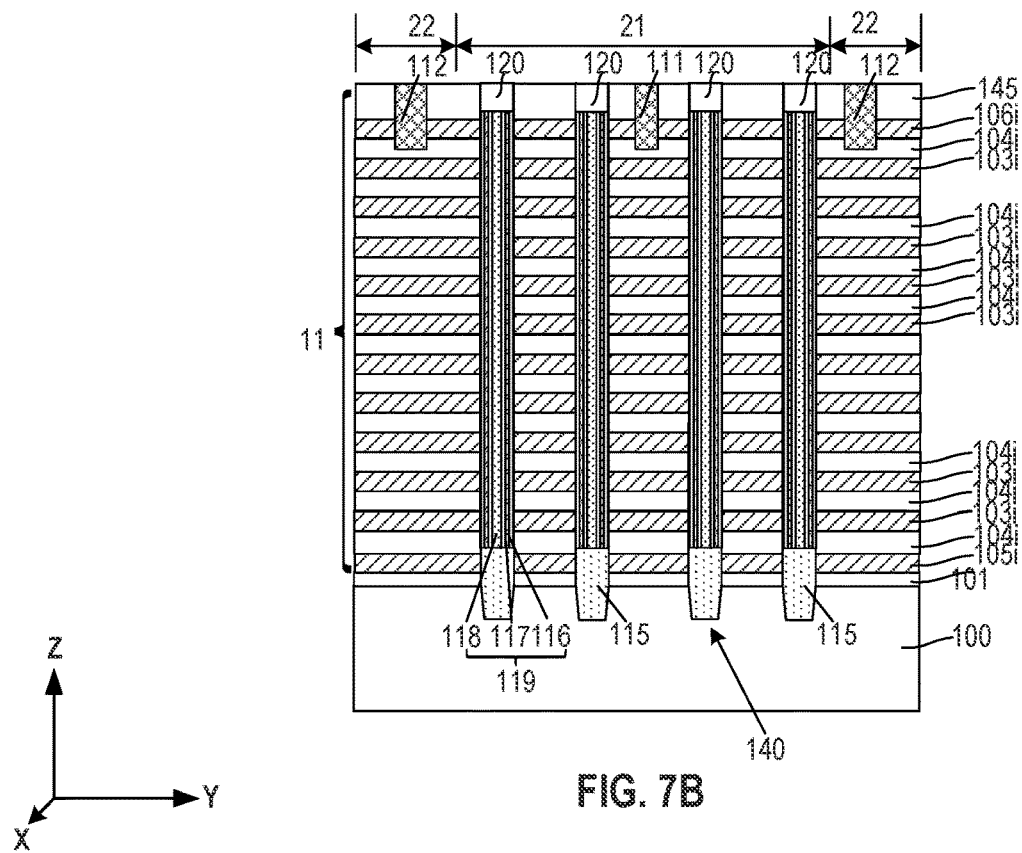
FIG. 7B illustrates a cross-sectional view of the 3D memory device illustrated in FIG. 7A along the A-B direction, according to some embodiments of the present disclosure.

Referring back to FIG. 14A, a plurality of channel structures are formed (Operation 1408). FIGS. 7A and 7B illustrate a corresponding structure 700.

As shown in FIGS. 7A and 7B, a plurality of channel structures 140 can be formed in channel region 41, e.g., in each block region 21. A plurality of channel holes may be formed extending vertically through stack structure 11. In some embodiments, a plurality of channel holes are formed through the interleaved initial sacrificial layers (103i, 105i, and 106i) and initial insulating layers 104i. The plurality of channel holes may be formed by performing an anisotropic etching process, using an etch mask such as a patterned PR layer, to remove portions of stack structure 11 and expose substrate 100. In some embodiments, at least one channel hole is formed on each side of dividing structures 112 along the y-direction. In some embodiments, a plurality of channel holes are formed in each block region 21. A recess region may be formed at the bottom of each channel hole to expose a top portion of substrate 100 by the same etching process that forms the channel hole above substrate 100 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as epitaxial portion 115. Optionally, a recess etch (e.g., dry etch and/or wet etch) may be performed to remove excess semiconductor material on the sidewall of the channel hole and/or control the top surface of epitaxial portion 115 at a desired position. In some embodiments, the top surface of epitaxial portion 115 is located between the top and bottom surfaces of the bottom initial insulating layer 104i.

In some embodiments, the channel holes are formed by performing a suitable etching process, e.g., an anisotropic etching process (e.g., dry etch) and/or an isotropic etching process (wet etch). In some embodiments, epitaxial portion 115 includes single crystalline silicon is formed by epitaxially grown from substrate 100. In some embodiments, epitaxial portion 115 includes polysilicon formed by a deposition process. The formation of epitaxially-grown epitaxial portion 115 can include, but not limited to, vapor-phase epitaxy (VPE), liquid-phase epitaxy (LPE), molecular-beam epitaxy (MPE), or any combinations thereof. The formation of deposited epitaxial portion 115 may include, but not limited by, CVD, PVD, and/or ALD.

In some embodiments, a semiconductor channel 119 is formed over and contacting epitaxial portion 115 in the channel hole. Semiconductor channel can include a channel-forming structure that has a memory film 116 (e.g., including a blocking layer, a memory layer, and a tunneling layer), a semiconductor layer 117 formed above and connecting epitaxial portion 115, and a dielectric core 118 filling up the rest of the channel hole. In some embodiments, memory film 116 is first deposited to cover the sidewall of the channel hole and the top surface of epitaxial portion 115, and semiconductor layer 117 is then deposited over memory film 116 and above epitaxial portion 115. The blocking layer, memory layer, and tunneling layer can be subsequently deposited in this order using one or more thin film deposition processes, such as ALD, CVD, PVD, any other suitable processes, or any combination thereof, to form memory film 116. Semiconductor layer 117 can then be deposited on the tunneling layer using one or more thin film deposition processes, such as ALD, CVD, PVD, any other suitable processes, or any combination thereof. In some embodiments, dielectric core 118 is filled in the remaining space of the channel hole by depositing dielectric materials after the deposition of semiconductor layer 117, such as silicon oxide.

In some embodiments, drain structure 120 is formed in the upper portion of each channel hole. In some embodiments, parts of memory film 116, semiconductor layer 117, and dielectric core 118 on the top surface of stack structure 11 and in the upper portion of each channel hole can be removed by CMP, grinding, wet etching, and/or dry etching to form a recess in the upper portion of the channel hole so that a top surface of semiconductor channel may be between the top surface and the bottom surface of dielectric cap layer 145. Drain structure 120 then can be formed by depositing conductive materials, such as metals, into the recess by one or more thin film deposition processes, such as CVD, PVD, ALD, electroplating, electroless plating, or any combination thereof. A channel structure 140 is thereby formed. A plurality of memory cells may subsequently be formed by the intersection of semiconductor channels 119 and control conductor layers 127. Optionally, a planarization process, e.g., dry/wet etch and/or CMP, is performed to remove any excess material on the top surface of stack structure 11.

Referring back to FIG. 14A, the plurality of dividing structures may be used as an etch mask to form a slit structure with a plurality of slit openings divided by the plurality of dividing structures (Operation 1410). FIGS. 9A-9E illustrate a corresponding structure 900.

As shown in FIGS. 9A-9E, a slit structure 123, having a plurality of slit openings, may be formed in second source region 22 extending along the x-direction. Along the x-direction, adjacent slit openings may be separated by a dividing structure 112 and the remaining portion of stack structure 11 covered by and under dividing structure 112. The slit openings may extend vertically through stack structure 11 and expose substrate 100. The patterned/etched initial sacrificial layers form a plurality of sacrificial layers in block regions 21 and a plurality of sacrificial portions covered by and under dividing structure 112. Each sacrificial portion may be in contact with, e.g., connected to, sacrificial layers of the same level in adjacent block regions 21 along the y-direction. The patterned/etched initial insulating layers form a plurality of insulating layers 104 in block regions 21 and a plurality of insulating portions 104-0 covered by and under dividing structure 112. Each insulating portion 104-0 may be in contact with, e.g., connected to, insulating layers 104 of the same level in adjacent block regions 21 along the y-direction. The plurality of insulating portions 104-0 and the plurality of sacrificial portions may be interleaved with one another extending from under a respective dividing structure 112 to substrate 100.

A width of dividing structure 112 along the y-direction may be equal to or greater than the width of the respective slit structure 123 (e.g., adjacent slit openings) along the y-direction. FIG. 13A illustrates an enlarged plan view 1310 of dividing structure 112 and adjacent slit openings. As shown in FIG. 13A, a width d2 of dividing structure 112 along the y-direction is equal to or greater than a width d1 of slit structure 123 along the y-direction. In some embodiments, d2 is greater than d1. In some embodiments, d2 being equal to or greater than d1 prevents the interleaved sacrificial portions and insulating portions 104-0 from being disconnected from adjacent block regions 21 during the formation of slit structure 123. That is, dividing structures 112 may keep adjacent memory blocks connected through the interleaved sacrificial portions and insulating portions 104-0 during the formation of slit structure 123. In some embodiments, dividing structures 112 is used as an etch mask and an anisotropic etching process, e.g., dry etch, is performed to remove portions of stack structure 11 in second source region 22 to form slit structure 123. The remaining portions of stack structure 11 in second source region 22 may form the interleaved sacrificial portions and insulating portions. Dividing structure 112 and underlying interleaved sacrificial portions and insulating portions 104-0 may form an initial support structure.

Referring back to FIGS. 9A-9E, in some embodiments, one or more other slit structures 124 may be formed in first source regions 23 by the same patterning/etching process that forms slit openings of slit structure 123. Each other slit structure 124, e.g., having a single slit opening, may extend along the x-direction and through stack structure 11 to expose substrate 100. In some embodiments, other slit structures 124 may extend in core region 31 and staircase region 32.

Referring back to FIG. 14A, a plurality of conductor layers, a plurality of memory blocks, and a plurality of support structures connecting adjacent memory blocks are formed (Operation 1412). FIGS. 9A-9E illustrate a corresponding structure.

As shown in FIGS. 9A-9E, sacrificial layers in block regions 21 and sacrificial portions retained in second source regions 22 may be removed to form a plurality of lateral recesses, and a suitable conductor material may be deposited to fill up the lateral recesses, forming a plurality of conductor layers (e.g., 127-129) in block regions 21 and a plurality of conductor portions (e.g., 127-0 and 128-0) in second source regions 22. A support structure 152, having dividing structure 112 and underlying interleaved conductor portions (e.g., 127-0 and 128-0) and insulating portions 104-0 may be formed. Control conductor layers 127 may intersect with semiconductor channels 119 and form a plurality of memory cells in each block region 21, which forms a memory block. In some embodiments, the top sacrificial layer in block regions 21 may form a top conductor layer 129, and the bottom sacrificial layer in block regions 21 may form a bottom conductor layer 128. In some embodiments, the initial support structure can form a support structure 152.

The conductor material may include one or more of tungsten, aluminum, copper, cobalt, silicides, and polysilicon. A suitable isotropic etching process, e.g., wet etch, can be performed to remove sacrificial layers and sacrificial portions, and form the plurality of lateral recesses. A suitable deposition process, such as CVD, PVD, ALD, and/or sputtering can be performed to deposit the conductor material into the lateral recesses to form conductor layers (e.g., 127-129) and conductor portions (e.g., 127-0 and 128-0).

Referring back to FIG. 14A, a source structure is formed in each slit structure (Operation 1414). FIGS. 10A-10E illustrate a corresponding structure 1000.

As shown in FIGS. 10A-10E, an insulating structure 136 may be formed in each slit opening of slit structure 123, and a source contact 125 may be formed in the respective insulating structure 136. The insulating structures 136 and the source contacts 125 in each second source region 22 may form a second source structure. An insulating structure 137 may be formed in each other slit structure 124, and a source contact 126 may be formed in each other slit structure 124. The insulating structure 137 and respective source contact 126 may form a first source structure. Support structure 152 may separate adjacent source contacts 125 and insulating structures 136 along the x-direction, and may connect adjacent memory blocks along the y-direction. In some embodiments, insulating structures 136 and 137 includes silicon oxide, and is deposited by one or more of CVD, PVD, ALD, and sputtering. A recess etch may be performed to remove portions of insulating structures 136 and 137 at the bottom of the respective slit structure to expose substrate 100. In some embodiments, source contacts 125 and 126 each includes one or more of tungsten, aluminum, copper, cobalt, silicides, and polysilicon, and a suitable deposition process, e.g., one or more of CVD, PVD, ALD, and sputtering, is performed to deposit source contacts 125 and 126 into respective slit structures.

Figure 11:
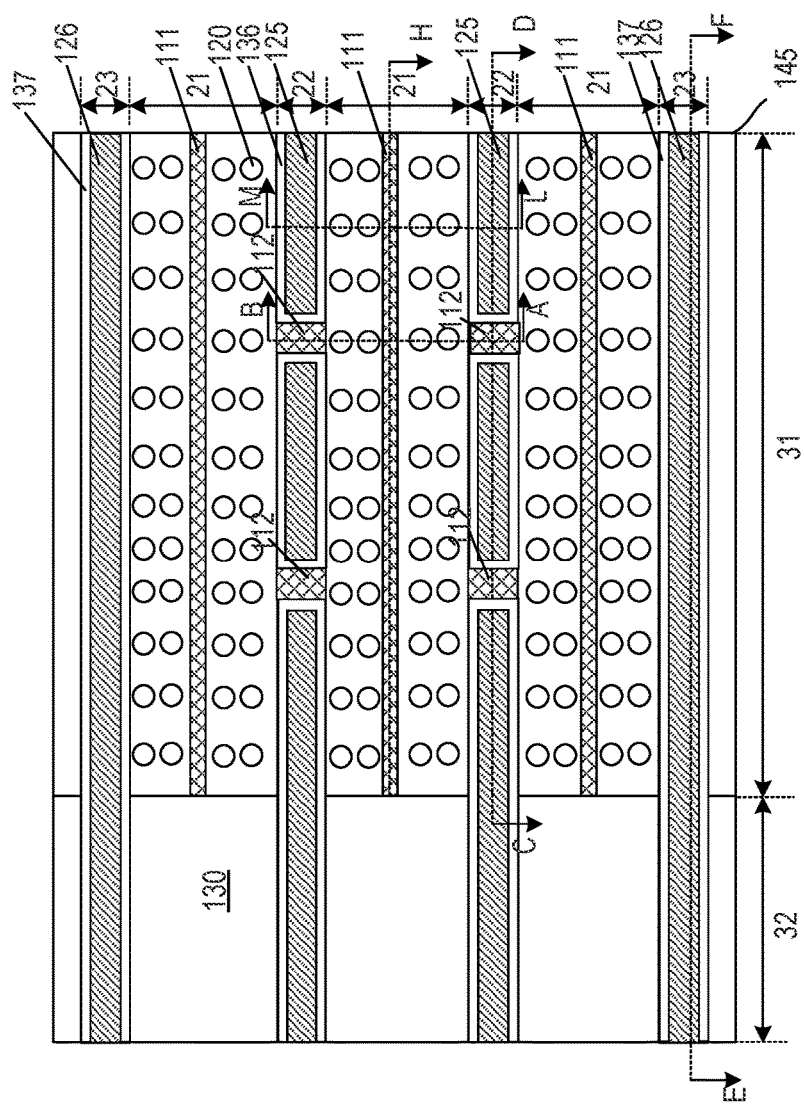
FIG. 11 illustrates a plan view of the exemplary 3D memory device at another stage of the fabrication process, according to some embodiments of the present disclosure.
Figure 12:
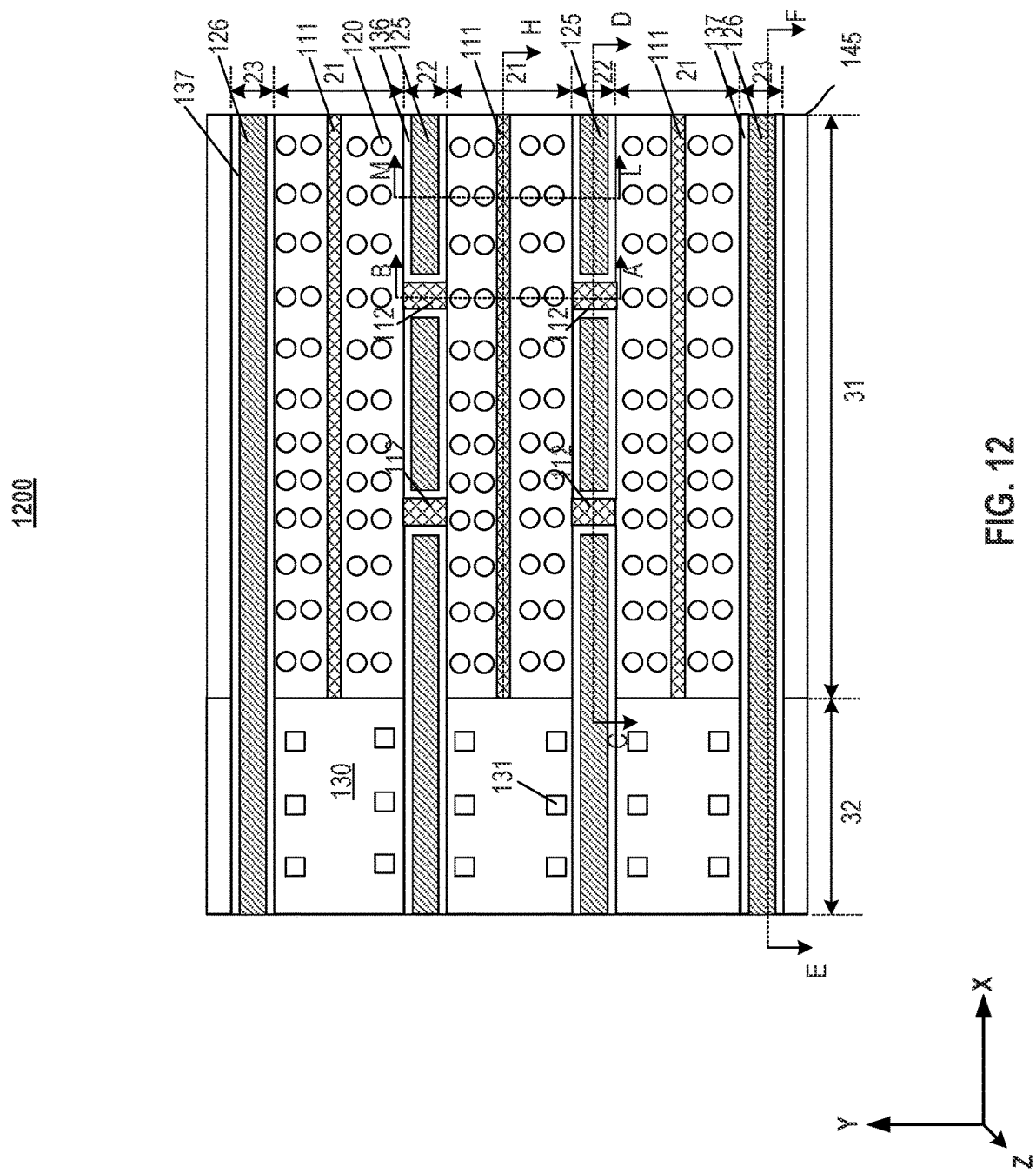
FIG. 12 illustrates a plan view of the exemplary 3D memory device at another stage of the fabrication process, according to some embodiments of the present disclosure.

Referring back to FIG. 14A, an insulator is formed in the staircase region and one or more contact plugs are formed in the insulator to contact the conductor layers (Operation 1416). FIGS. 11 and 12 illustrate corresponding structures 1100 and 1200.

As shown in FIGS. 11 and 12, an insulator 130 can be formed in staircase region 32 to cover the staircases (e.g., conductor layers 127-129) and insulate contact plugs 131 from one another. One or more contact plugs 131 are formed in insulator 130 to contact and form an conductive connection with conductor layers 127-129. In some embodiments, insulator 130 includes silicon oxide and is deposited by one or more of CVD, PVD, ALD, and sputtering. A suitable anisotropic etching process, e.g., dry etch, can be performed to form one or more plug openings through insulator 130 and expose one or more conductor layers (e.g., 127, 128, and/or 129). A suitable conductive material, such as tungsten, is deposited to fill up the plug openings. In some embodiments, at least one contact plug is formed on one conductor layer (e.g., 127, 128, and/or 129). Optionally, a planarization process, e.g., CMP and/or recess etch, is performed to remove any excess material, e.g., from the formation of various structures, over stack structure 11.

Figure 14B:
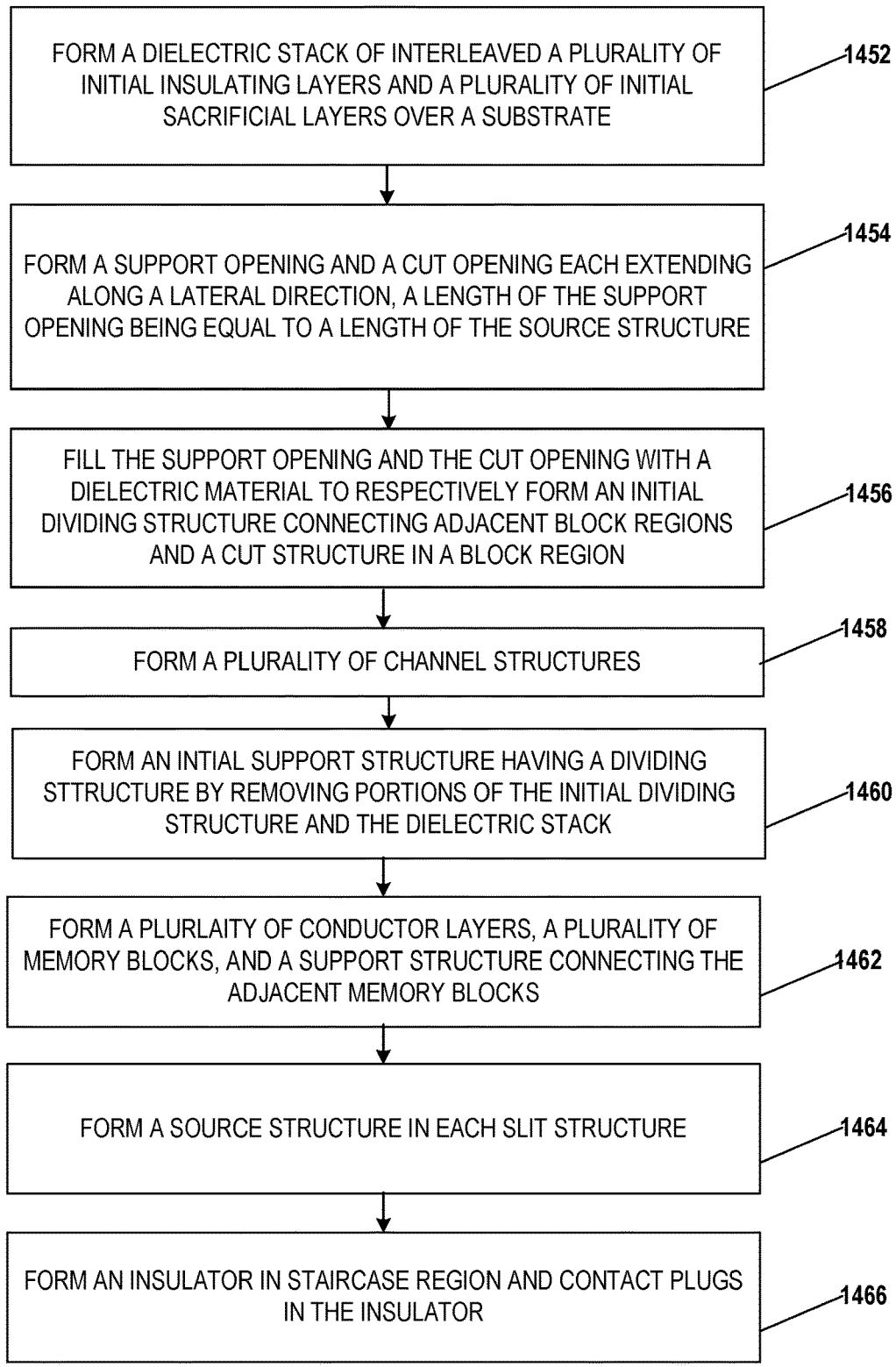
FIG. 14B illustrates a flowchart of another exemplary fabrication process for forming a 3D memory device with support structures in a slit structure, according to some embodiments of the present disclosure.

FIGS. 2, 5, 6 and 8-12 illustrates another fabrication process to form 3D memory device 150, and FIG. 14B illustrates a flowchart 1450 of the fabrication process, according to some embodiments. Different from the fabrication process illustrated in FIGS. 2-4, 7, and 9-12, one or more initial dividing structures are formed and etched to form one or more dividing structures. For ease of illustration, same or similar operations illustrated in FIGS. 2-4, 7, and 9-12 are not repeated in the description.

At the beginning of the process, a stack structure of interleaved a plurality of initial insulating layers and a plurality of initial sacrificial layers are formed (Operation 1452). FIGS. 2A-2D illustrate a corresponding structure 200. The description of the fabrication process and structure 200 can be referred to the description of Operation 1402 and is not repeated herein.

Figure 5A:
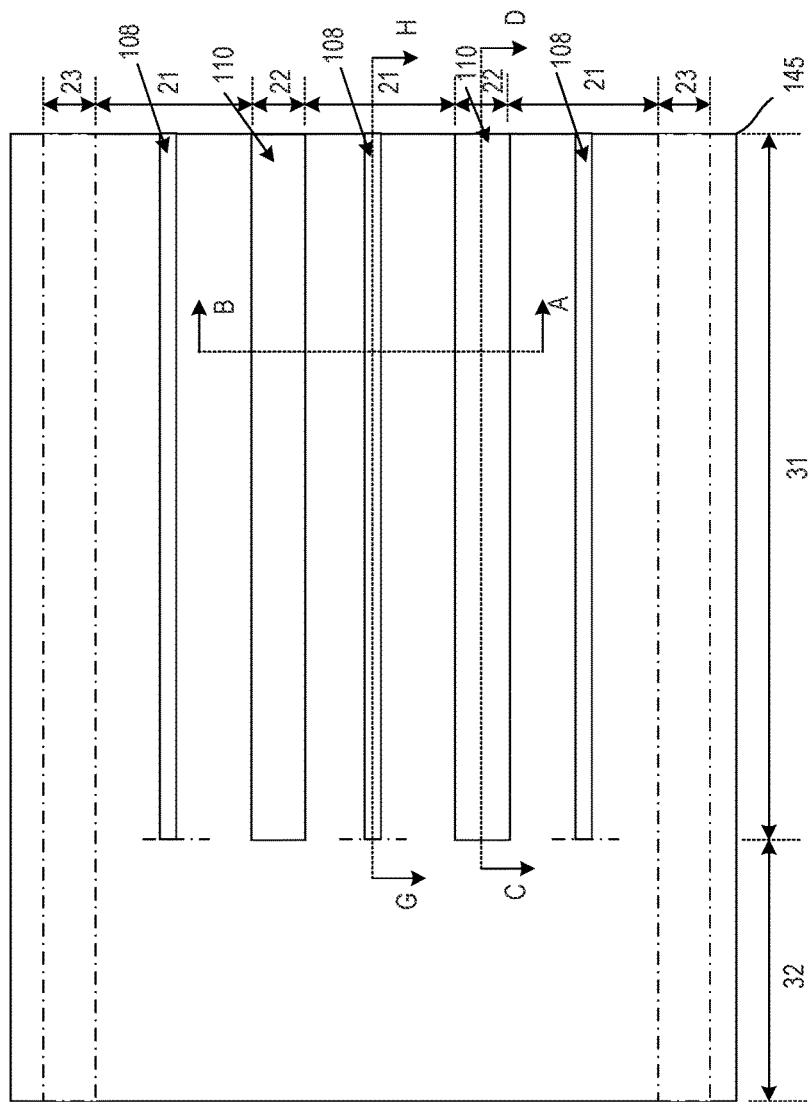
FIG. 5A illustrates a plan view of the exemplary 3D memory device at another stage of the fabrication process, according to some embodiments of the present disclosure.
Figure 5A:
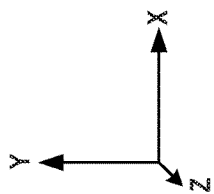
Figure 5B:
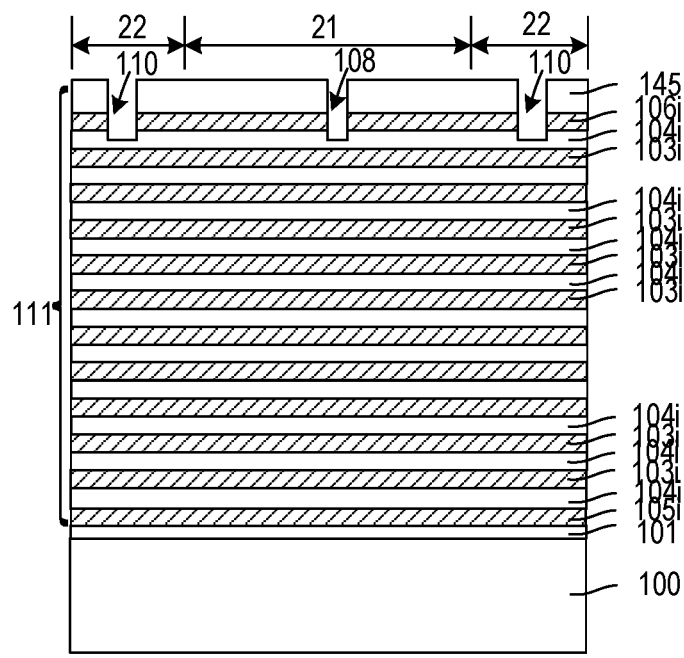
FIG. 5B illustrates a cross-sectional view of the 3D memory device illustrated in FIG. 5A along the A-B direction, according to some embodiments of the present disclosure.
Figure 5C:
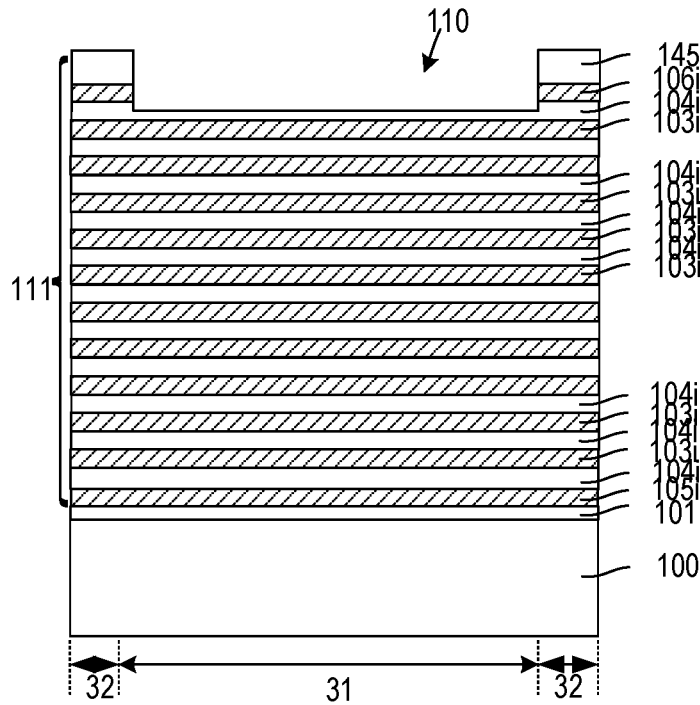
FIG. 5C illustrates a cross-sectional view of the 3D memory device illustrated in FIG. 5A along the C-D direction, according to some embodiments of the present disclosure.

Referring back to FIG. 14B, a support opening can be formed extending along a lateral direction, a length of the support opening being equal to a length of the source structure (Operation 1454). Optionally, a cut opening is formed extending along the lateral direction. FIGS. 5A-5C illustrate a corresponding structure 500.

As shown in FIGS. 5A-5D, a support opening 110 is formed in second source region 22. Along the x-direction, a length of support opening 110 may be equal to a length of the second source structure to be formed (or the length of second source region 22 or the slit structure in which the second source structure is formed). Along the y-direction, a width of support opening 109 may be greater than or equal to a width of second source region 22. In some embodiments, a bottom surface of support opening 110 may be between a top surface and a bottom surface of first initial insulating layer 104i (e.g., the initial insulating layer 104i) under top initial sacrificial layer 106i. Optionally, one or more cut openings 108 are formed in a block region 21. The fabrication of support opening 110 and any cut opening 108 can be referred to the fabrication of support openings 109 and cut openings 108 described in FIGS. 3A-3D and is not repeated herein. In some embodiments, a depth of support opening 110 is the same as a depth of cut opening 108 along the vertical direction, e.g., the bottom surfaces of support opening 110 and cut opening 108 being on the same level of top initial insulating layer 104*i*.

Figure 6A:
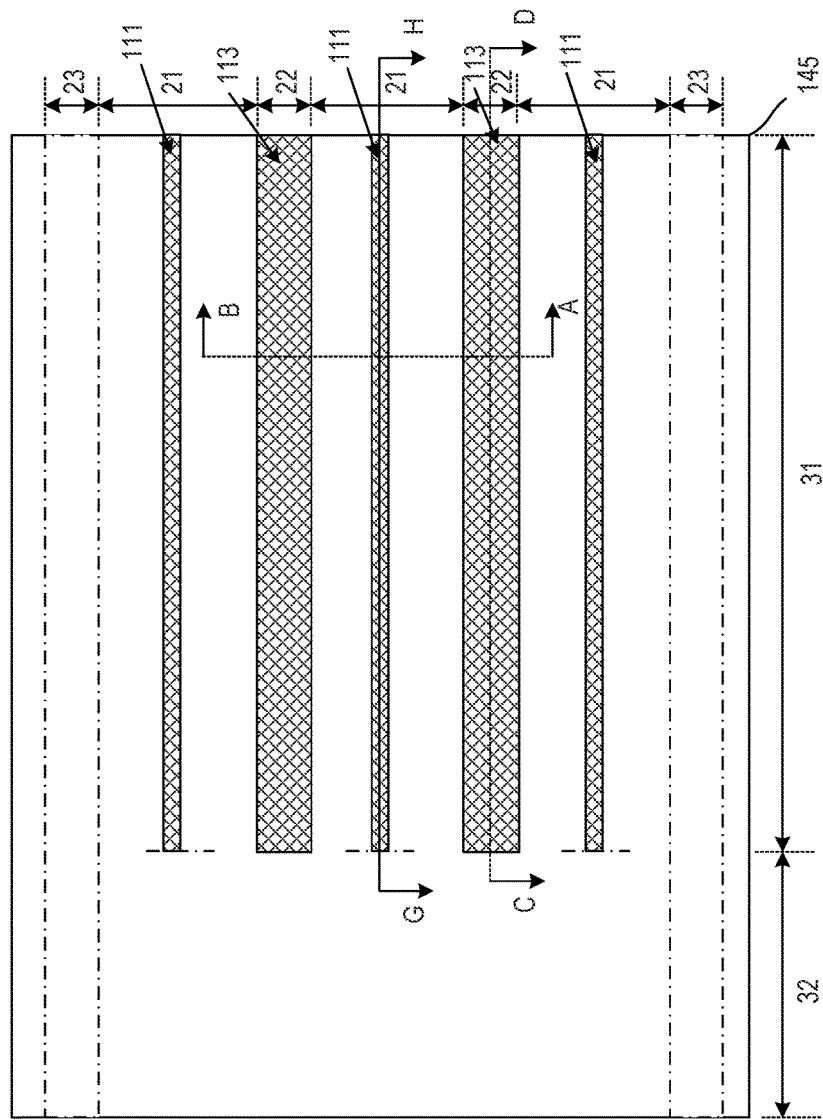
FIG. 6A illustrates a plan view of the exemplary 3D memory device at another stage of the fabrication process, according to some embodiments of the present disclosure.
Figure 6B:
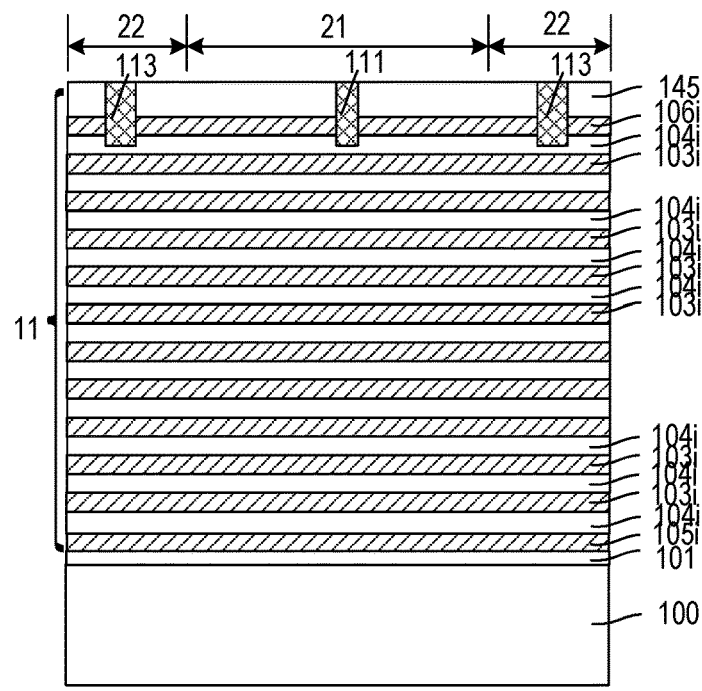
FIG. 6B illustrates a cross-sectional view of the 3D memory device illustrated in FIG. 6A along the A-B direction, according to some embodiments of the present disclosure.
Figure 6C:
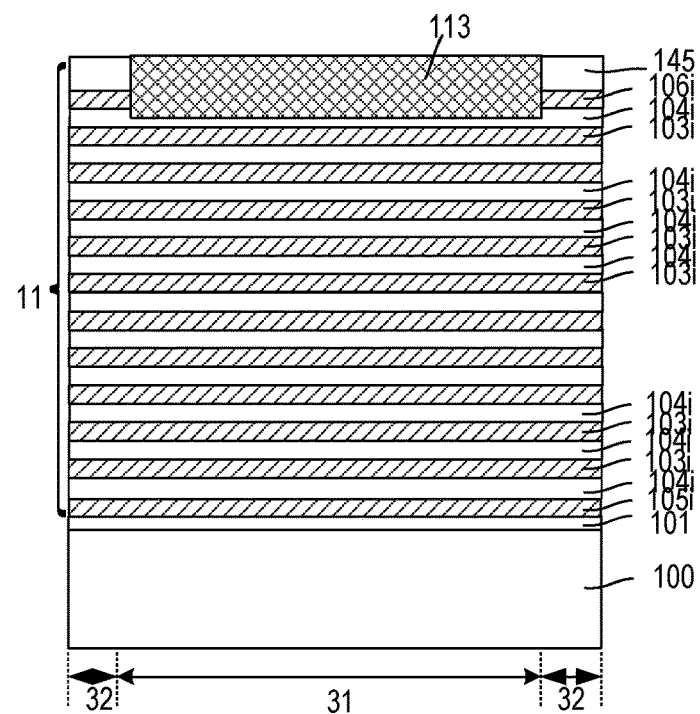
FIG. 6C illustrates a cross-sectional view of the 3D memory device illustrated in FIG. 6A along the C-D direction, according to some embodiments of the present disclosure.

Referring to back to FIG. 14B, the support opening is filled with a dielectric material to form an initial dividing structure connecting adjacent block regions (Operation 1456). Optionally, any cut opening is filled with the dielectric material to form a cut structure in the block region. FIGS. 6A-6C illustrate a corresponding structure 600.

As shown in FIGS. 6A-6C, a dielectric material can be deposited to fill up support opening 110 and form an initial dividing structure 113. In some embodiments, initial dividing structure 113 is located between adjacent block regions 21. In some embodiments, a length of initial dividing structure 113 is equal to the length of the second source structure or slit structure to be formed. Any cut opening can be filled with the dielectric material to form a cut structure 111 in the respective block region. The deposition of dielectric material to form initial dividing structure 113 and any cut structure 111 can be referred to the formation of dividing structure 112 and cut structure 111 described in FIGS. 4A-4C and is not repeated herein.

Figure 8A:
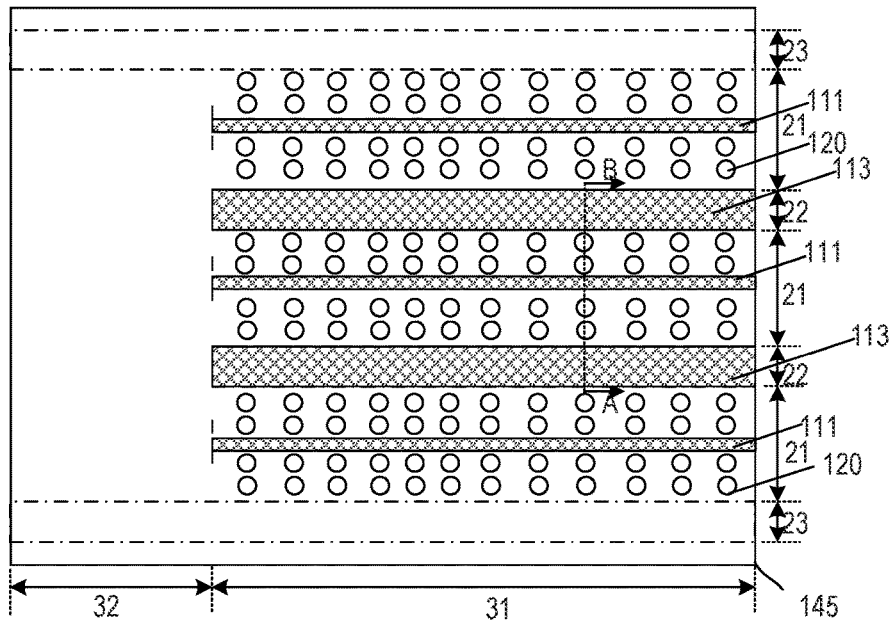
FIG. 8A illustrates a plan view of the exemplary 3D memory device at another stage of the fabrication process, according to some embodiments of the present disclosure.
Figure 8B:
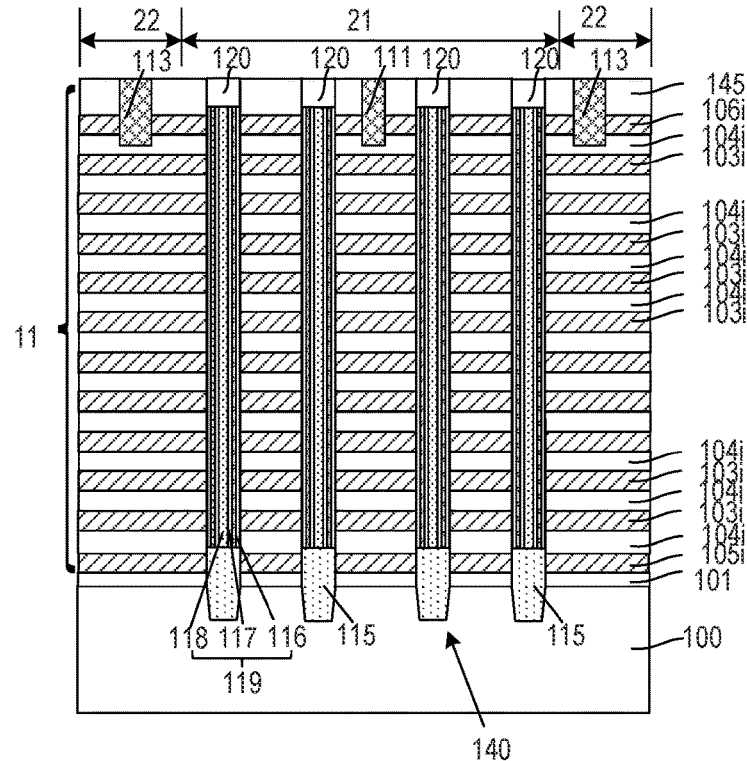
FIG. 8B illustrates a cross-sectional view of the 3D memory device illustrated in FIG. 8A along the A-B direction, according to some embodiments of the present disclosure.
Figure 9A:
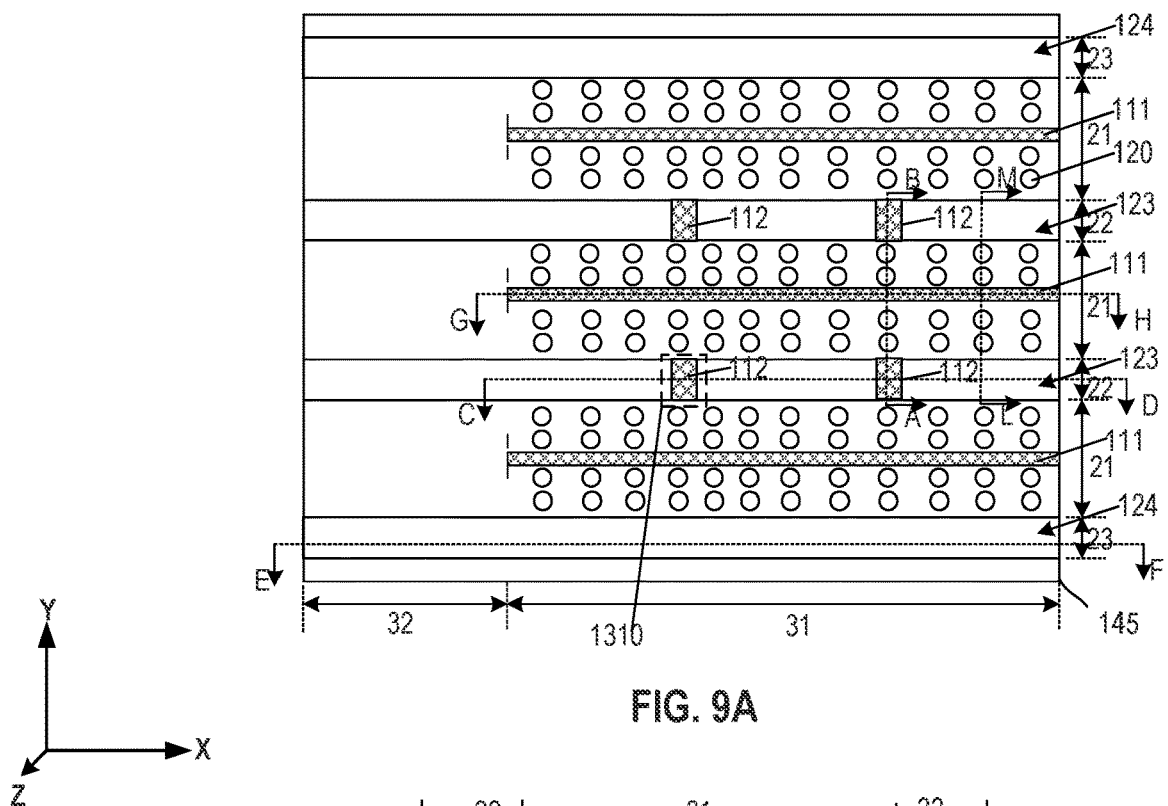
FIG. 9A illustrates a plan view of the exemplary 3D memory device at another stage of the fabrication process, according to some embodiments of the present disclosure.
Figure 9B:
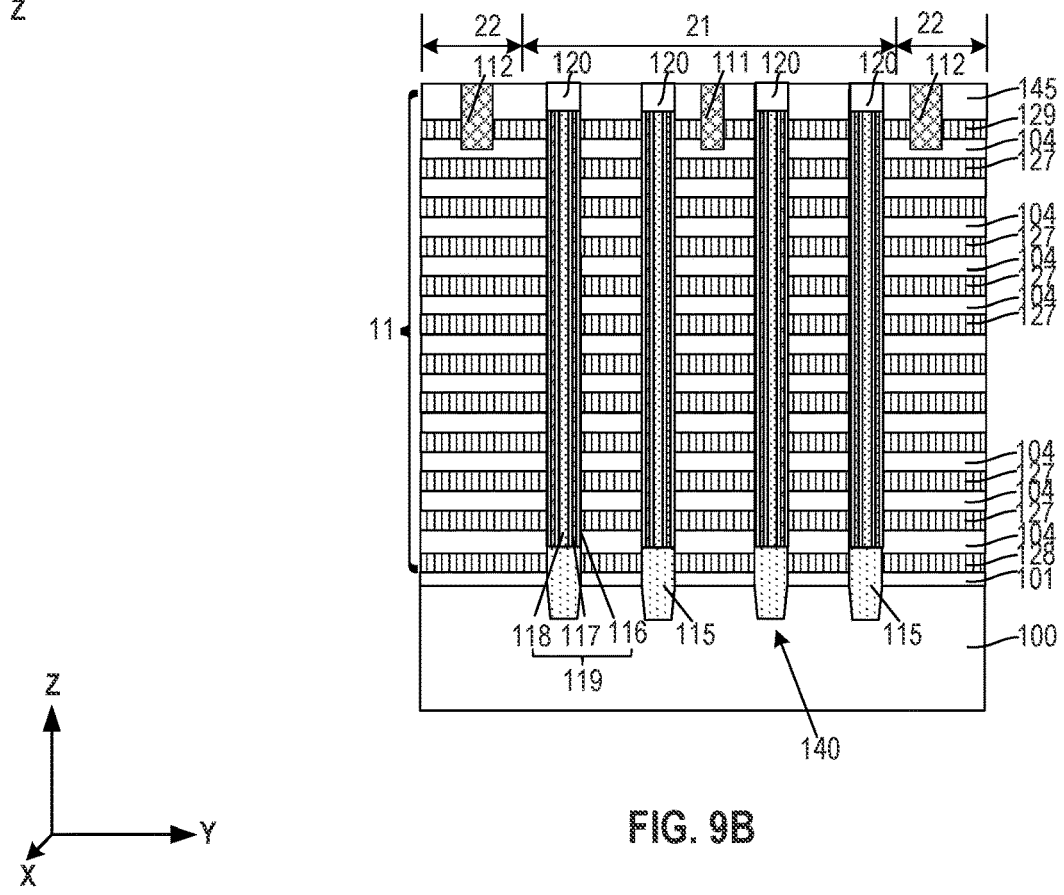
FIG. 9B illustrates a cross-sectional view of the 3D memory device illustrated in FIG. 9A along the A-B direction, according to some embodiments of the present disclosure.
Figure 9C:
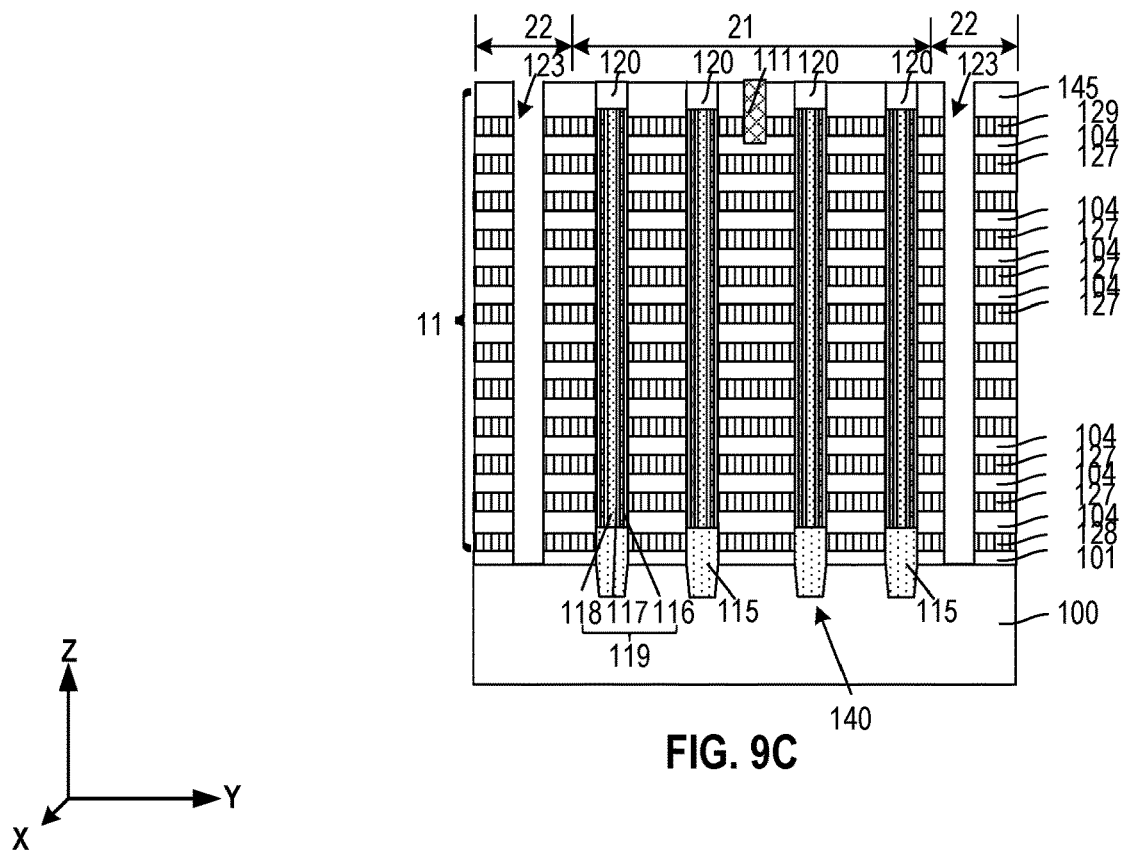
FIG. 9C illustrates a cross-sectional view of the 3D memory device illustrated in FIG. 9A along the L-M direction, according to some embodiments of the present disclosure.
Figure 9D:
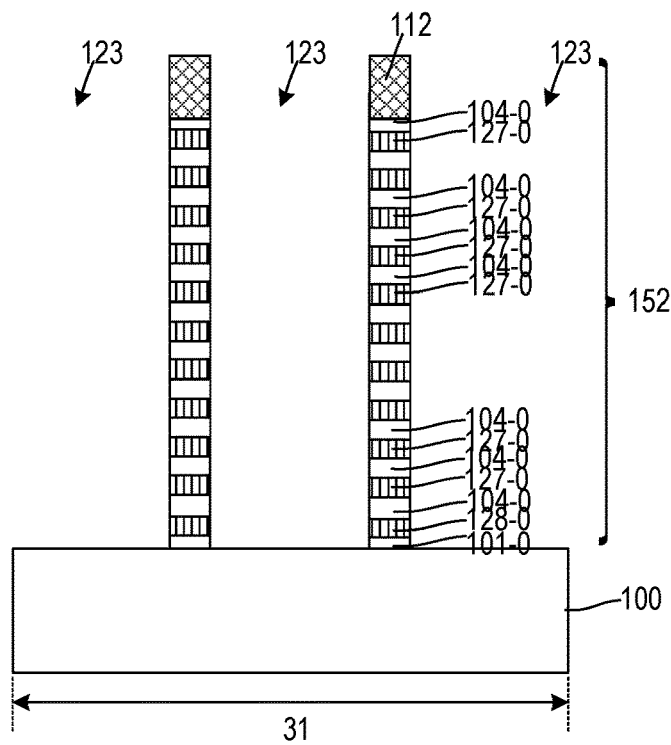
FIG. 9D illustrates a cross-sectional view of the 3D memory device illustrated in FIG. 9A along the C-D direction, according to some embodiments of the present disclosure.
Figure 9E:
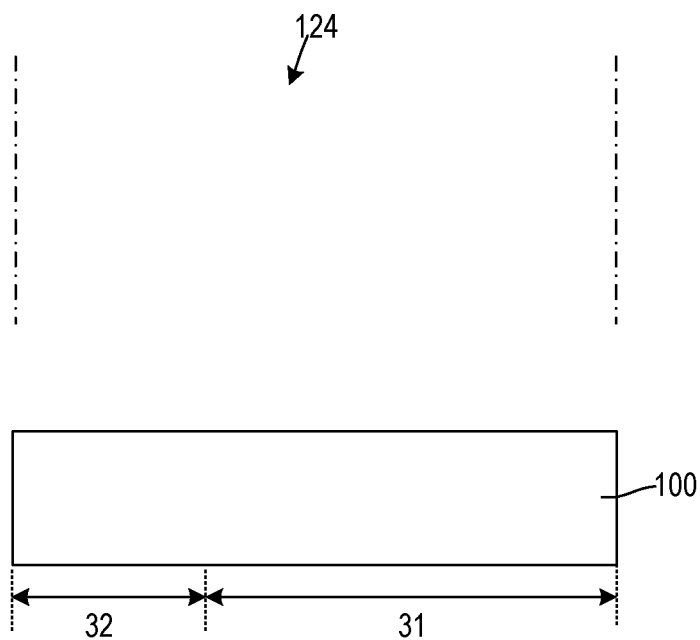
FIG. 9E illustrates a cross-sectional view of the 3D memory device illustrated in FIG. 9A along the E-F direction, according to some embodiments of the present disclosure.
Figure 10A:
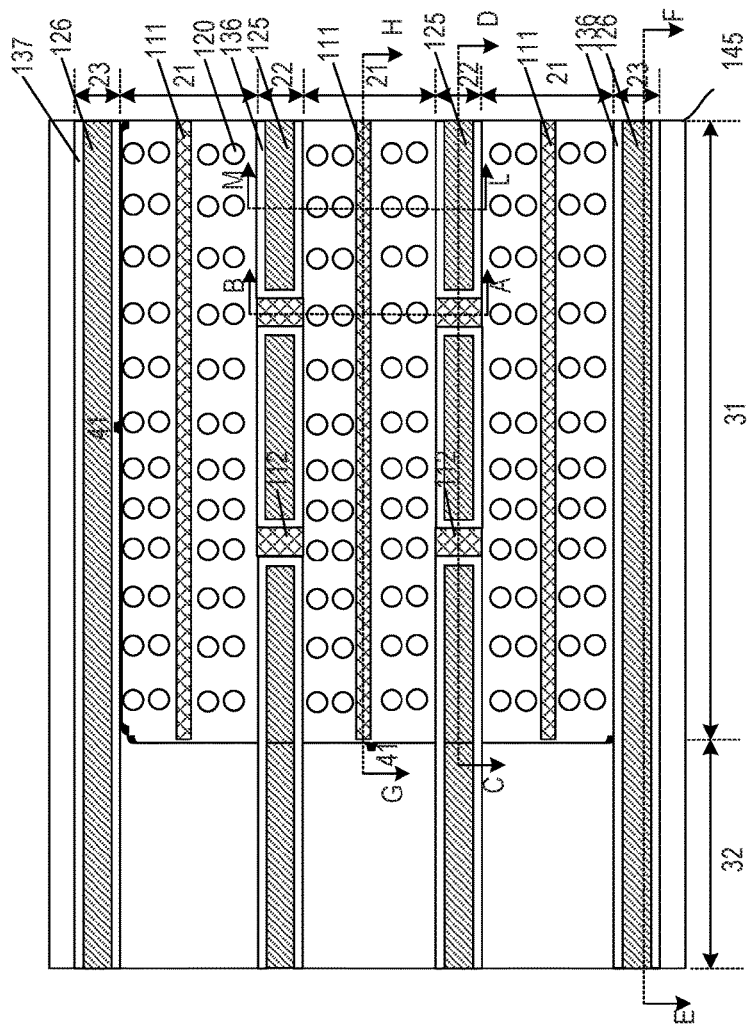
FIG. 10A illustrates a plan view of the exemplary 3D memory device at another stage of the fabrication process, according to some embodiments of the present disclosure.
Figure 10B:
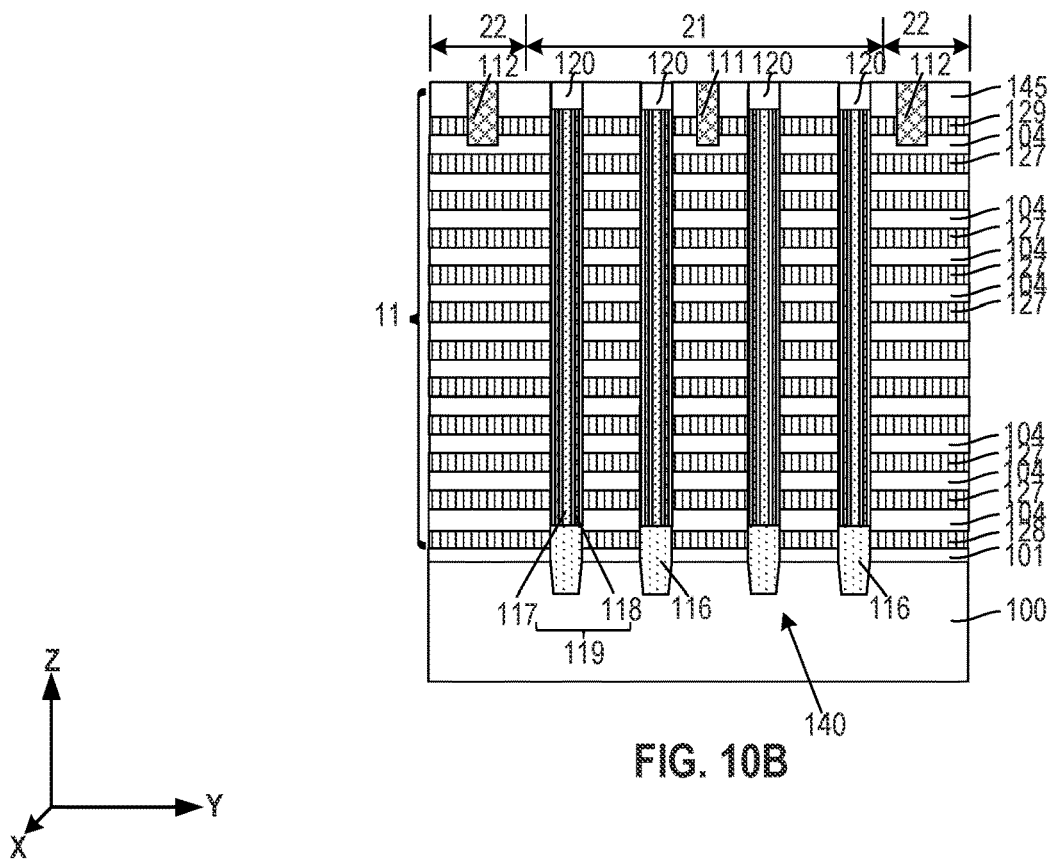
FIG. 10B illustrates a cross-sectional view of the 3D memory device illustrated in FIG. 10A along the A-B direction, according to some embodiments of the present disclosure.
Figure 10C:
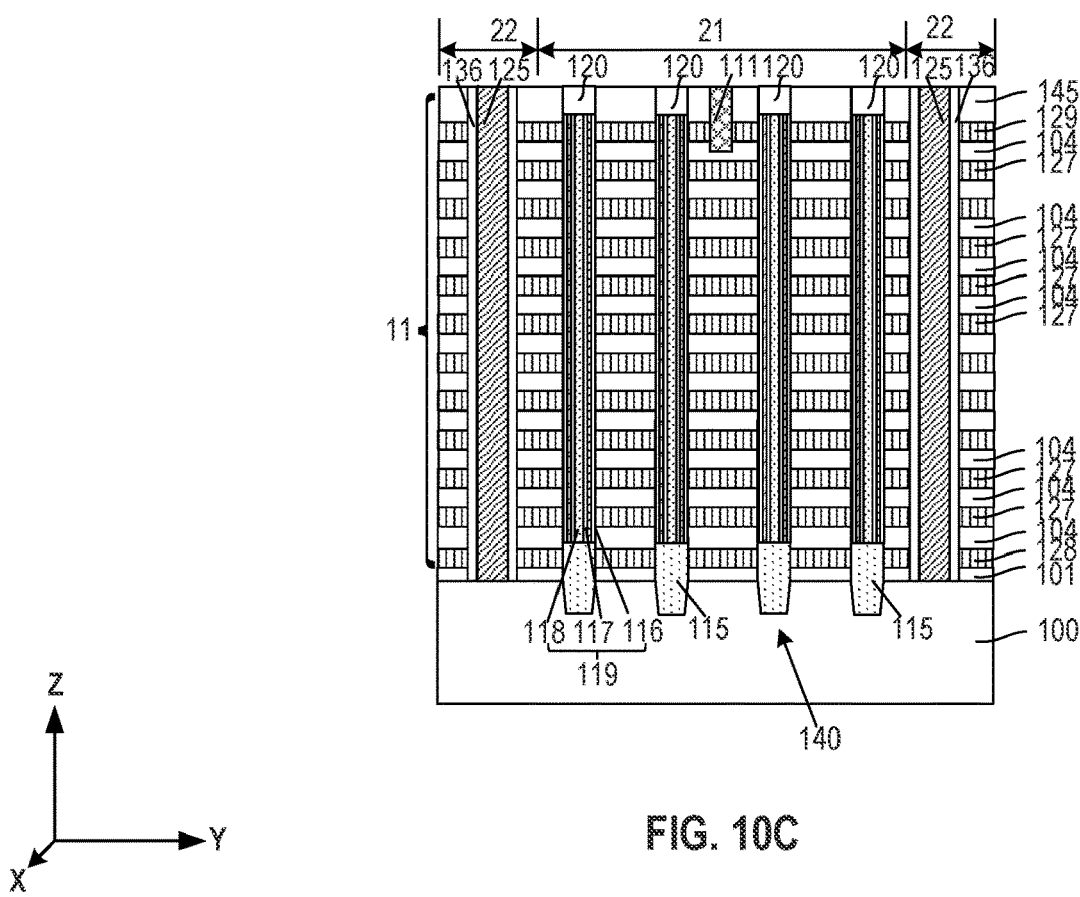
FIG. 10C illustrates a cross-sectional view of the 3D memory device illustrated in FIG. 10A along the L-M direction, according to some embodiments of the present disclosure.
Figure 10D:
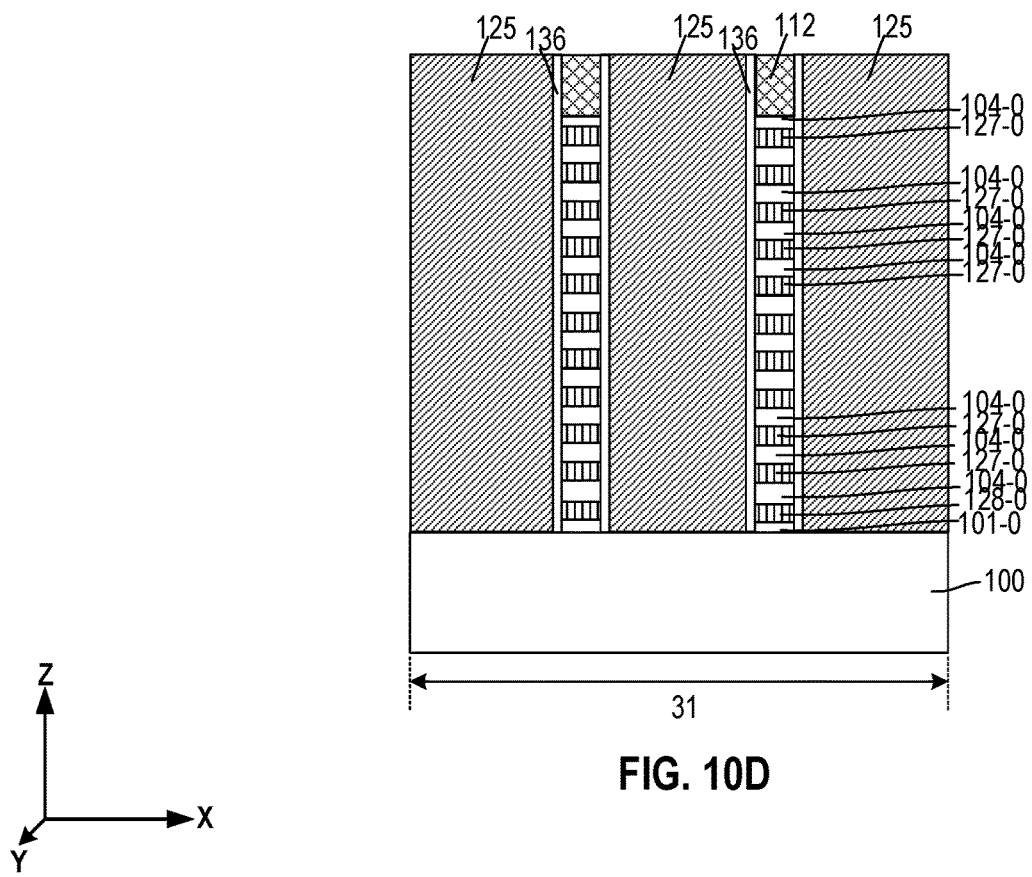
FIG. 10D illustrates a cross-sectional view of the 3D memory device illustrated in FIG. 10A along the C-D direction, according to some embodiments of the present disclosure.
Figure 10E:
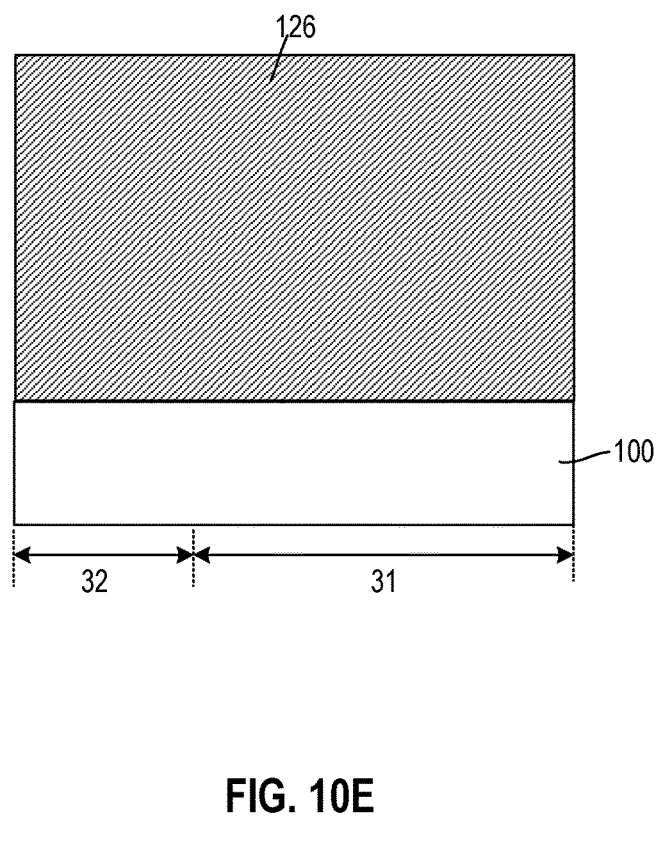
FIG. 10E illustrates a cross-sectional view of the 3D memory device illustrated in FIG. 10A along the E-F direction, according to some embodiments of the present disclosure.

Referring back to FIG. 14B, a plurality of channel structures can be formed (Operation 1458). FIGS. 8A and 8B illustrate a corresponding structure 800.

As shown in FIGS. 8A and 8B, a plurality of channel structures 140 can be formed in channel region 41. In some embodiments, at least one channel structure 140 is formed on each side of initial dividing structure 113 along the y-direction. In some embodiments, a plurality of channel structures 140 are formed in each block regions 21. The formation of channel structures 140 can be referred to the formation of channel structures 140 described in FIGS. 7A and 7B and is not repeated herein.

Referring back to FIG. 14B, an initial support structure having a dividing structure is formed (Operation 1460). Portions of the initial dividing structure can be removed to form a dividing structure, and the dividing structure can be used as an etch mask to remove portions of the stack structure and form the initial support structure. FIGS. 9A-9E illustrate a corresponding structure 900.

As shown in FIGS. 9A-9E, portions of initial dividing structure 113 can be removed to form one or more dividing structure 112 arranged along the x-direction and expose portions of stack structure 11. In some embodiments, top initial insulating layer 104*i* is exposed. The dividing structures 112 can be used as an etch mask to remove portions of stack structure 11 exposed in second source region 22 to form a slit structure 123 with a plurality of disconnected slit openings that expose substrate 100. Initial dividing structure 113 and stack structure 11 can be patterned/etched using the same patterning/etching process or separate patterning/etching processes. For example, initial dividing structure 113 may first be patterned to form dividing structures 112, and a different etching process can be performed to remove exposed portions of stack structure 11, and form slit openings of slit structure 123 and one or more initial support structures. Alternatively, initial dividing structure 113 and portions of stack structure 11 under initial dividing structure 113 can be patterned using the same etching process to form slit openings of slit structure 123 and one or more initial support structures. In some embodiments, initial dividing structure 113 and stack structure 11 are patterned using the same etching process to reduce the steps and time of the patterning operation. Initial dividing structure 113 and stack structure 11 can be patterned/etched using one or more suitable etching processes, e.g., dry etch and/or wet etch. Details of the initial support structures can be referred to the description of initial support structures described in FIGS. 9A-9E of flowchart 1400 and are not repeated herein.

Referring back to FIG. 14B, a plurality of conductor layers, a plurality of memory blocks, and a support structure are formed (Operation 1462) and a source structure is formed in each slit structure (Operation 1464). An insulator and contact plugs are formed in the staircase region (Operation 1466). FIGS. 9-12 illustrate corresponding structures 900-1200. Detailed descriptions of Operations 1462-1466 can be referred to the description of Operations 1412-1416 and are not repeated herein.

In some embodiments, a 3D memory device includes a memory stack having interleaved a plurality of conductor layers and a plurality of insulating layers extending laterally in the memory stack. The 3D memory device also includes a plurality of channel structures extending vertically through the memory stack into the substrate, the plurality of channel structures and the plurality of conductor layers intersecting with one another and forming a plurality of memory cells. The 3D memory device further includes at least one slit structure extending vertically and laterally in the memory stack and dividing the plurality of memory cells into at least one memory block, the at least one slit structure each including a plurality of slit openings and a support structure between adjacent slit openings. The support structure may be in contact with adjacent memory blocks and contacting the substrate. The 3D memory device further includes a source structure having an insulating spacer in each of the plurality of slit openings and a source contact in a respective insulating spacer.

In some embodiments, the support structure extends vertically through the memory stack to the substrate and is insulated from adjacent source contacts by respective insulating spacers of the adjacent source contacts.

In some embodiments, the support structure includes a dividing structure over interleaved a plurality of conductor portions and a plurality of insulating portions. The dividing structure may extend laterally to connect the adjacent memory blocks and extends vertically into a first insulating layer of the memory stack. The interleaved plurality of conductor portions and plurality of insulating portions are each in contact with corresponding conductor layers and corresponding insulating layers of the same level from adjacent memory blocks.

In some embodiments, along another lateral direction perpendicular to a lateral direction along which the at least one slit structure extends, a width of the dividing structure is greater than or equal to a width of each of the adjacent slit openings.

In some embodiments, the dividing structure includes at least one of silicon oxide, silicon nitride, or silicon oxynitride.

In some embodiments, the plurality of conductor portions includes at least one of tungsten, aluminum, copper, cobalt, silicides, or polysilicon. In some embodiments, the plurality of insulating portions includes at least one of silicon oxide, silicon nitride, or silicon oxynitride.

In some embodiments, the plurality of conductor portions and the conductor layers of adjacent memory blocks are made of a same material, the plurality of insulating portions and the insulating layers of adjacent memory blocks are made of a same material.

In some embodiments, the source contact each includes at least one of tungsten, aluminum, copper, cobalt, silicides, or polysilicon.

In some embodiments, the 3D memory device further includes a cut structure extending laterally and vertically in parallel with the slit structure in the at least one memory block and dividing the at least one memory block into a plurality of memory fingers.

In some embodiments, the cut structure extends vertically into the first insulating layer of the memory stack and includes at least one of silicon oxide, silicon nitride, or silicon oxynitride. A depth of the cut structure may be the same as a depth of the dividing structure.

In some embodiments, the plurality of channel structures each includes an epitaxial portion, a semiconductor channel, and a drain structure, the epitaxial portion being conductively connected to the substrate, the semiconductor channel being conductively connected to the epitaxial portion and the dielectric cap layer, and the drain structure being conductively connected to the semiconductor channel.

In some embodiments, a top surface of the semiconductor channel is between a top and a bottom surface of a dielectric cap layer over the interleaved plurality of conductor layers and plurality of insulating layer, a top surface of the epitaxial portion is between a top and a bottom surface of a bottom insulating layer, and the semiconductor channel includes a blocking layer, a memory layer, a tunneling layer, a semiconductor layer, and a dielectric core arranged inwardly from a sidewall to a center of the semiconductor channel.

In some embodiments, a method for forming a 3D memory device includes forming a dielectric stack including interleaved a plurality of initial insulating layers and a plurality of initial sacrificial layers over a substrate, and forming at least one slit structure extending vertically and laterally in the dielectric stack and dividing the dielectric stack into a plurality of block regions. The at least one slit structure each includes a plurality of slit openings exposing the substrate and an initial support structure between adjacent slit openings. Each of the plurality of block regions may include interleaved a plurality of insulating layers and a plurality of sacrificial layers, and the initial support structure may include interleaved plurality of insulating portions and sacrificial portions. Each of the plurality of insulating portions and sacrificial portions may be in contact with respective insulating layers and sacrificial layers of a same level from adjacent block regions. In some embodiments, the method also includes forming a plurality of channel structures extending vertically through the dielectric stack, replacing the plurality of sacrificial layers and the plurality of sacrificial portions with a plurality of conductor layers and a plurality of conductor portions through the at least one slit structure, and forming a source structure in each slit structure. The source structure may include an insulating spacer in each of the plurality of slit openings and a source contact in a respective insulating spacer.

In some embodiments, forming the at least one slit structure includes patterning the dielectric stack to form a support opening along a lateral direction the respective slit structure extends. A length of the support opening may be less than a length of the slit structure along the lateral direction. A bottom of the support opening may be between a top and a bottom surfaces of a first initial insulating layer of the dielectric stack. Forming the at least one slit structure also includes depositing a dielectric material to fill up the support opening and form a dividing structure.

In some embodiments, forming the at least one slit structure includes removing portions of the dielectric stack adjacent to the dividing structure along the lateral direction to form a pair of slit openings that expose the substrate. A width of each of the pair of slit openings may be less than or equal to a width of the dividing structure along another lateral direction perpendicular to the lateral direction. In some embodiments, the dividing structure and remaining interleaved sacrificial portions and insulating portions under the dividing structure form the initial support structure.

In some embodiments, removing the portions of the dielectric stack includes using the dividing structure as an etch mask to etch the portions of the dielectric stack adjacent to the dividing structure and retain the interleaved sacrificial portions and insulating portions under the dividing structure.

In some embodiments, forming the plurality of channel structures includes forming at least one channel structure on both sides of the dividing structure along the other lateral direction.

In some embodiments, forming the at least one slit structure includes patterning the dielectric stack to form a support opening along a lateral direction the respective slit structure extends. A length of the support opening may be equal to a length of the slit structure along the lateral direction. A bottom of the support opening may be between a top and a bottom surfaces of a first initial insulating layer of the dielectric stack. In some embodiments, forming the at least one slit structure also includes depositing a dielectric material to fill up the support opening and form an initial dividing structure.

In some embodiments, forming the at least one slit structure further includes, along the lateral direction, of the initial dividing structure, removing a pair of second portions adjacent to a first portion to expose portions of the dielectric stack under the second portions. In some embodiments, forming the at least one slit structure also includes removing the exposed portions of the dielectric stack to expose the substrate and form a pair of slit openings. A width of each of the pair of slit openings may be less than or equal to a width of the initial dividing structure along another lateral direction perpendicular to the lateral direction. A remaining first portion of the initial dividing structure may form a dividing structure. The dividing structure and remaining interleaved sacrificial portions and insulating portions under the dividing structure may form the initial support structure.

In some embodiments, removing the exposed portions of the dielectric stack includes using the dividing structure as an etch mask to etch the portions of the dielectric stack adjacent to the dividing structure and retain the interleaved conductor portions and insulating portions under the dividing structure.

In some embodiments, forming the plurality of channel structures includes forming at least one channel structure on both sides of the initial dividing structure along the other lateral direction.

In some embodiments, replacing the plurality of sacrificial layers and the plurality of sacrificial portions with the plurality of conductor layers and the plurality of conductor portions through the at least one slit structure includes removing, in a same etching process, the plurality of sacrificial portions of the initial support structure and the plurality of sacrificial layers of the plurality of block regions to form a plurality of lateral recesses. Replacing the plurality of sacrificial layers and the plurality of sacrificial portions may also include depositing, in a same deposition process, a conductor material into the plurality of lateral recesses with. The plurality of conductor layers and the plurality of channel structures may form a plurality of memory cells. The plurality of block regions may form a plurality of memory blocks. The dividing structure and the underlying interleaved conductor portions and insulating portions may form a support structure.

In some embodiments, the method further includes forming a cut structure in at least one of the plurality of block regions, the cut structure extends in parallel with the at least one slit structure and divides the at least one of the plurality of memory blocks into a plurality of memory fingers.

In some embodiments, forming the cut structure includes forming a cut opening in the at least one of the plurality of block regions in a same patterning operation that forms the support opening. The cut opening may extend in parallel with the at least one slit structure. A bottom surface of the cut opening may be between a top surface and a bottom surfaces of the first initial insulating layer. In some embodiments, forming the cut structure also includes depositing a dielectric material to fill up the cut opening in a same deposition operation that fills the support opening, forming the cut structure.

In some embodiments, forming the plurality of channel structures includes forming a plurality of channel holes extending vertically from a dielectric cap layer over the dielectric stack into the substrate and forming an epitaxial portion in each of the plurality of channel holes. The epitaxial portion may be conductively connected to the substrate. In some embodiments, forming the plurality of channel structures also includes forming a semiconductor channel over the epitaxial portion and forming a drain structure over the semiconductor channel. The drain structure may be conductively connected to the semiconductor channel. The semiconductor may be conductively connected to the epitaxial portion.

In some embodiments, a method for forming a 3D memory device includes forming a dielectric stack of interleaved plurality of initial insulating layers and plurality of initial sacrificial layers over a substrate, forming a dielectric structure extending along a lateral direction in the dielectric stack, the dielectric structures extending vertically into a first initial insulating layer, and patterning the dielectric stack using the dielectric structure as an etch mask to form a slit structure extending vertically and laterally in the dielectric stack and dividing the dielectric stack into a pair of block regions. The slit structure may include a plurality of slit openings exposing the substrate and a plurality of initial support structure between adjacent slit openings. Each of the plurality of block regions may include interleaved a plurality of insulating layers and sacrificial layers, and each of the plurality of initial support structure may include interleaved a plurality of insulating portions and a plurality of sacrificial portions. Each of the plurality of insulating portions and sacrificial portions may be in contact with respective insulating layers and sacrificial layers of a same level from adjacent block regions. The method may also include forming a plurality of channel structures extending vertically through the dielectric stack, replacing the plurality of sacrificial layers and the plurality of sacrificial portions with a plurality of conductor layers and a plurality of conductor portions through the at least one slit structure, and forming a source structure in each slit structure. The source structure may include an insulating spacer in each of the plurality of slit openings and a source contact in a respective insulating spacer.

In some embodiments, the dielectric structure includes a plurality of dividing structures being disconnected from one another, and forming the dielectric structure includes patterning the dielectric stack to form a plurality of support openings along the lateral direction. A length of each of the plurality of support openings may be less than a length of the slit structure along the lateral direction. The plurality of support openings may each be disconnected from one another and have a bottom surface between a top and a bottom surfaces of the first initial insulating layer. In some embodiments, forming the dielectric structure also includes depositing a dielectric material to fill up the plurality of support openings and form the plurality of dividing structures.

In some embodiments, forming the at least one slit structure includes removing portions of the dielectric stack adjacent to each of the plurality of dividing structure along the lateral direction to form the plurality of slit openings. A width of each of the plurality of slit openings may be less than or equal to a width of the dividing structure along another lateral direction perpendicular to the lateral direction. In some embodiments, forming the at least one slit structure also includes the dividing structure and remaining interleaved sacrificial portions and insulating portions under the dividing structure form the initial support structure.

In some embodiments, removing the portions of the dielectric stack includes using the dividing structure as an etch mask to etch the portions of the dielectric stack adjacent to the dividing structure and retain the interleaved sacrificial portions and insulating portions under the dividing structure.

In some embodiments, forming the plurality of channel structures includes forming at least one channel structure on both sides of the dielectric structure along the other lateral direction.

In some embodiments, the dielectric structure includes one initial dividing structure, and forming the dielectric structure includes patterning the dielectric stack to form a support opening extending along the lateral direction. A length of the support opening may be equal to a length of the slit structure along the lateral direction, and a bottom of the support opening may be between a top and a bottom surfaces of a first initial insulating layer of the dielectric stack. In some embodiments, forming the dielectric structure also includes depositing a dielectric material to fill up the support opening and form the initial dividing structure.

In some embodiments, forming the at least one slit structure further includes, along the lateral direction, of the initial dividing structure, removing a pair of second portions adjacent to a first portion to expose portions of the dielectric stack under the second portions. In some embodiments, forming the at least one slit structure also includes removing the exposed portions of the dielectric stack to expose the substrate and form a pair of slit openings. A width of each of the pair of slit openings may be less than or equal to a width of the initial dividing structure along another lateral direction perpendicular to the lateral direction. A remaining first portion of the initial dividing structure may form a dividing structure. The dividing structure and remaining interleaved sacrificial portions and insulating portions under the dividing structure may form the initial support structure.

In some embodiments, removing the exposed portions of the dielectric stack includes using the dividing structure as an etch mask to etch the portions of the dielectric stack adjacent to the dividing structure and retain the interleaved conductor portions and insulating portions under the dividing structure.

In some embodiments, forming the plurality of channel structures includes forming at least one channel structure on both sides of the initial dividing structure along the other lateral direction.

In some embodiments, replacing the plurality of sacrificial layers and the plurality of sacrificial portions with the plurality of conductor layers and the plurality of conductor portions includes removing, in a same etching process, the plurality of sacrificial portions of the initial support structure and the plurality of sacrificial layers of the plurality of block regions to form a plurality of lateral recesses. In some embodiments, replacing the plurality of sacrificial layers and the plurality of sacrificial portions with the plurality of conductor layers and the plurality of conductor portions also includes depositing, in a same deposition process, a conductor material into the plurality of lateral recesses with. The plurality of conductor layers and the plurality of channel structures may form a plurality of memory cells. The plurality of block regions may form a plurality of memory blocks. The dividing structure and the underlying interleaved conductor portions and insulating portions may form a support structure.

In some embodiments, the method further includes forming a cut structure in at least one of the plurality of block regions. The cut structure may extend in parallel with the at least one slit structure and divides the at least one of the plurality of memory blocks into a plurality of memory fingers.

In some embodiments, forming the cut structure includes forming a cut opening in the at least one of the plurality of block regions in a same patterning operation that forms the support openings. The cut opening may extend in parallel with the at least one slit structure, and a bottom surface of the cut opening may be between a top surface and a bottom surfaces of the first initial insulating layer. In some embodiments, forming the cut structure also includes depositing a dielectric material to fill up the cut opening in a same deposition operation that fills the support openings, forming the cut structure.

In some embodiments, forming the plurality of channel structures includes forming a plurality of channel holes extending vertically from a dielectric cap layer over the dielectric stack into the substrate, forming an epitaxial portion in each of the plurality of channel holes, the epitaxial portion being conductively connected to the substrate, forming a semiconductor channel over the epitaxial portion, the semiconductor being conductively connected to the epitaxial portion, and forming a drain structure over the semiconductor channel, the drain structure being conductively connected to the semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising interleaved a plurality of conductor layers and a plurality of insulating layers extending laterally in the memory stack;
a plurality of channel structures extending vertically through the memory stack into a substrate, the plurality of channel structures and the plurality of conductor layers intersecting with one another and forming a plurality of memory cells;
at least one slit structure extending vertically and laterally in the memory stack and dividing the plurality of memory cells into at least one memory block, the at least one slit structure each comprising a plurality of slit openings and a support structure between adjacent slit openings, the support structure being in contact with adjacent memory blocks and contacting the substrate and comprising a dividing structure over interleaved a plurality of conductor portions and a plurality of insulating portions; and
a source structure comprising an insulating spacer in each of the plurality of slit openings and a source contact in a respective insulating spacer, adjacent source contacts in the source structure being disconnected from each other.

2. The 3D memory device of claim 1, wherein the support structure extends vertically through the memory stack to the substrate and is insulated from adjacent source contacts by respective insulating spacers of the adjacent source contacts.

3. The 3D memory device of claim 1, wherein
the dividing structure extends laterally to connect the adjacent memory blocks and extends vertically into a first insulating layer of the memory stack; and
the interleaved plurality of conductor portions and plurality of insulating portions are each in contact with corresponding conductor layers and corresponding insulating layers of the same level from adjacent memory blocks.

4. The 3D memory device of claim 3, wherein along another lateral direction perpendicular to a lateral direction along which the at least one slit structure extends, a width of the dividing structure is greater than or equal to a width of each of the adjacent slit openings.

5. The 3D memory device of claim 1, wherein the dividing structure comprises at least one of silicon oxide, silicon nitride, or silicon oxynitride.

6. The 3D memory device of claim 5, wherein
the plurality of conductor portions comprises at least one of tungsten, aluminum, copper, cobalt, silicides, or polysilicon; and
the plurality of insulating portions comprises at least one of silicon oxide, silicon nitride, or silicon oxynitride.

7. The 3D memory device of claim 6, wherein
the plurality of conductor portions and the conductor layers of adjacent memory blocks comprise a same material; and
the plurality of insulating portions and the insulating layers of adjacent memory blocks comprise a same material.

8. The 3D memory device of claim 5, further comprising a cut structure extending laterally and vertically in parallel with the slit structure in the at least one memory block and dividing the at least one memory block into a plurality of memory fingers, wherein the cut structure extends vertically into a first insulating layer of the memory stack and comprises at least one of silicon oxide, silicon nitride, or silicon oxynitride, a depth of the cut structure being the same as a depth of the dividing structure.

9. A three-dimensional (3D) memory device, comprising:
a memory stack comprising interleaved a plurality of conductor layers and a plurality of insulating layers extending laterally in the memory stack;
a plurality of channel structures extending vertically through the memory stack into a substrate, the plurality of channel structures and the plurality of conductor layers intersecting with one another and forming a plurality of memory cells;
at least one slit structure extending vertically and laterally in the memory stack and dividing the plurality of memory cells into at least one memory block, the at least one slit structure each comprising a plurality of slit openings and a support structure between adjacent slit openings, the support structure being in contact with adjacent memory blocks and contacting the substrate and comprising a dividing structure over interleaved a plurality of conductor portions and a plurality of insulating portions; and
a source structure comprising an insulating spacer in each of the plurality of slit openings and a source contact in a respective insulating spacer, a top surface of the dividing structure being coplanar with top surfaces of adjacent source contacts in the source structure.

10. The 3D memory device of claim 9, wherein the support structure extends vertically through the memory stack to the substrate and is insulated from adjacent source contacts by respective insulating spacers of the adjacent source contacts.

11. The 3D memory device of claim 9, wherein
the dividing structure extends laterally to connect the adjacent memory blocks and extends vertically into a first insulating layer of the memory stack; and
the interleaved plurality of conductor portions and plurality of insulating portions are each in contact with corresponding conductor layers and corresponding insulating layers of the same level from adjacent memory blocks.

12. The 3D memory device of claim 11, wherein along another lateral direction perpendicular to a lateral direction along which the at least one slit structure extends, a width of the dividing structure is greater than or equal to a width of each of the adjacent slit openings.

13. The 3D memory device of claim 9, wherein the dividing structure comprises at least one of silicon oxide, silicon nitride, or silicon oxynitride.

14. The 3D memory device of claim 13, wherein
the plurality of conductor portions comprises at least one of tungsten, aluminum, copper, cobalt, silicides, or polysilicon; and
the plurality of insulating portions comprises at least one of silicon oxide, silicon nitride, or silicon oxynitride.

15. The 3D memory device of claim 14, wherein
the plurality of conductor portions and the conductor layers of adjacent memory blocks comprise a same material; and
the plurality of insulating portions and the insulating layers of adjacent memory blocks comprise a same material.

16. A three-dimensional (3D) memory device, comprising:
a memory stack comprising interleaved a plurality of conductor layers and a plurality of insulating layers extending laterally in the memory stack;
a plurality of channel structures extending vertically through the memory stack into a substrate, the plurality of channel structures and the plurality of conductor layers intersecting with one another and forming a plurality of memory cells;
at least one slit structure extending vertically and laterally in the memory stack and dividing the plurality of memory cells into at least one memory block, the at least one slit structure each comprising a plurality of slit openings and a support structure between adjacent slit openings, the support structure being in contact with adjacent memory blocks and contacting the substrate and comprising a dividing structure over interleaved a plurality of conductor portions and a plurality of insulating portions, a bottom surface of the dividing structure being between a top surface and a bottom surface of a first insulating layer; and
a source structure comprising an insulating spacer in each of the plurality of slit openings and a source contact in a respective insulating spacer.

17. The 3D memory device of claim 16, wherein the support structure extends vertically through the memory stack to the substrate and is insulated from adjacent source contacts by respective insulating spacers of the adjacent source contacts.

18. The 3D memory device of claim 16, wherein
the dividing structure extends laterally to connect the adjacent memory blocks and extends vertically into a first insulating layer of the memory stack; and
the interleaved plurality of conductor portions and plurality of insulating portions are each in contact with corresponding conductor layers and corresponding insulating layers of the same level from adjacent memory blocks.

19. The 3D memory device of claim 18, wherein along another lateral direction perpendicular to a lateral direction along which the at least one slit structure extends, a width of the dividing structure is greater than or equal to a width of each of the adjacent slit openings.

20. The 3D memory device of claim 16, wherein
the dividing structure comprises at least one of silicon oxide, silicon nitride, or silicon oxynitride;
the plurality of conductor portions comprises at least one of tungsten, aluminum, copper, cobalt, silicides, or polysilicon; and
the plurality of insulating portions comprises at least one of silicon oxide, silicon nitride, or silicon oxynitride.

* * * * *